(12) United States Patent
Matsuo

(10) Patent No.: US 8,278,990 B2
(45) Date of Patent: Oct. 2, 2012

(54) ELECTRIC FUSE CUTOFF CONTROL CIRCUIT RENEWING CUTOFF INFORMATION AND SEMICONDUCTOR DEVICE

(75) Inventor: Tatsuru Matsuo, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 118 days.

(21) Appl. No.: 12/728,428

(22) Filed: Mar. 22, 2010

(65) Prior Publication Data

US 2010/0244933 A1    Sep. 30, 2010

(30) Foreign Application Priority Data

Mar. 25, 2009    (JP) .................................. 2009-74935

(51) Int. Cl.
 *H01H 37/76*    (2006.01)
(52) U.S. Cl. ..................................... 327/525; 365/225.7
(58) Field of Classification Search .................. 327/525, 327/526; 365/225.7
See application file for complete search history.

(56) References Cited

U.S. PATENT DOCUMENTS

| | | | |
|---|---|---|---|
| 6,363,021 B2* | 3/2002 | Noh | 365/200 |
| 6,646,933 B1* | 11/2003 | Shubat et al. | 365/200 |
| 7,110,313 B2* | 9/2006 | Huang | 365/225.7 |
| 7,254,079 B2 | 8/2007 | Sumi et al. | |
| 7,397,720 B2* | 7/2008 | Sumi et al. | 365/225.7 |
| 7,426,254 B2* | 9/2008 | Kim | 377/75 |
| 7,436,718 B2* | 10/2008 | Tanaka et al. | 365/201 |
| 7,577,930 B2* | 8/2009 | Bailey et al. | 716/113 |
| 7,675,313 B1* | 3/2010 | Tang et al. | 326/8 |
| 7,706,202 B2* | 4/2010 | Obayashi et al. | 365/225.7 |
| 2005/0013187 A1* | 1/2005 | Anand et al. | 365/225.7 |
| 2007/0201259 A1* | 8/2007 | Van Gorsel | 365/96 |
| 2010/0214816 A1* | 8/2010 | Choi et al. | 365/96 |

FOREIGN PATENT DOCUMENTS

JP    2006-197272 A    7/2006

* cited by examiner

*Primary Examiner* — Thomas J Hiltunen
(74) *Attorney, Agent, or Firm* — Arent Fox LLP

(57) ABSTRACT

An electric fuse cutoff control circuit controlling cutoff of a plurality of electric fuses including: a cutoff information storage circuit adapted to store cutoff information about whether or not each of the plurality of electric fuses is cut off; a cutoff information control circuit controlling the cutoff of the plurality of electric fuses based on an output signal of the cutoff information storage circuit; and a cutoff information renewal circuit receiving an output signal of the cutoff information control circuit and renewing the cutoff information set for the cutoff information storage circuit.

20 Claims, 18 Drawing Sheets

FIG. 7

| INPUT DATA | | OUTPUT DATA | |
|---|---|---|---|
| ST(Q) | INk~IN1 | OUTk~OUT1 | |
| 0 | XXX...XXX | XXX...XXX | |
| 1 | →000...000 | 000...001 | ←-- COUNT VALUE = 0 |
|   | 000...001 | 000...011 | |
|   | 000...011 | 000...111 | |
|   | ≀ | ≀ | |
|   | →011...111 | 111...111 | ←-- COUNT VALUE = k-1 |
|   | 111...111 | 111...111 | |

FIG. 9

| PATTERN | EN | SFF1~SFF12 | EN1~EN12 | WE1~WE12 | FIN | OPERATION |
|---|---|---|---|---|---|---|
| PP1 | 0 | 0100 0100 1000 | 0100 0100 0000 | 0000 0000 0000 | 1 | SCAN IN |
| PP2 | 1 | 0100 0100 1000 | 0100 0100 0000 | 0100 0100 0000 | 1 | CUT OFF ELECTRIC FUSES CORRESPONDING TO 2ND AND 6TH BITS |
| PP3 | 0 | 0000 0000 1000 | 0000 0000 1000 | 0000 0000 0000 | 1 | RENEW CUTOFF INFORMATION |
| PP4 | 1 | 0000 0000 1000 | 0000 0000 1000 | 0000 0000 1000 | 1 | CUT OFF ELECTRIC FUSE CORRESPONDING TO 9TH BIT |
| PP5 | 0 | 0000 0000 0000 | 0000 0000 0000 | 0000 0000 0000 | 0 | RENEW CUTOFF INFORMATION |

FIG. 13

| INPUT DATA | | OUTPUT DATA |
|---|---|---|
| ST(Q) | INk~IN1 | OUTk~OUT1 |
| 0 | XXX···XXX | XXX···XXX |
| 1 | 000···000 | 000···001 |
| 1 | 000···001 | 000···010 |
| 1 | 000···010 | 000···011 |
| 1 | 000···011 | 000···100 |
| 1 | ~ | ~ |
| 1 | 011···110 | 011···111 |
| 1 | 011···111 | 100···000 |
| 1 | 100···000 | 100···001 |
| 1 | 100···001 | 100···010 |
| 1 | ~ | ~ |
| 1 | 111···110 | 111···111 |
| 1 | 111···111 | 100···000 |

ELECTRIC FUSE CUTOFF CONTROL CIRCUIT RENEWING CUTOFF INFORMATION AND SEMICONDUCTOR DEVICE

CROSS-REFERENCE TO RELATED APPLICATIONS

This application is based upon and claims the benefit of priority of the prior Japanese Patent Application No. 2009-74935, filed on Mar. 25, 2009, the entire contents of which are incorporated herein by reference.

FIELD

Aspects of the present invention described herein relate to an electric fuse cutoff control circuit and a semiconductor device.

BACKGROUND

Electric fuses are generally used in various semiconductor devices as nonvolatile storage elements.

For example, an electric fuse is used as a nonvolatile storage element for holding recovery data for a redundant memory, identification data inherent in a chip, encrypted data for security, or trimming data for adjusting a voltage or timing in an internal circuit.

For example, the electric fuse is cut off and the resistance value of the electric fuse changes by causing a current to flow therethrough. For example, when the electric fuse is used as a nonvolatile storage element, the electric fuse is not cut off to write data "0" and is cut off to write data "1."

The data "0" and "1" may be set reversely. For example, the electric fuse may be cut off to write data "0" and may be not cut off (may remain unchanged) to write data "1." The electric fuses for writing data are provided in various semiconductor devices and each of the semiconductor devices may include two or more such electric fuses.

Typically, an operation for writing given data by causing a current to flow through an electric fuse is performed using a large scale integration (LSI) tester. The LSI tester reads and checks the data, which has been written in two or more electric fuses provided in a semiconductor device, using a readout circuit in which the data is determined to be "0" or "1" based on the resistance value of each electric fuse.

Such semiconductor devices including electric fuses have been developed in a variety of ways. Known examples include a semiconductor device in which information on cutoff of an electric fuse is provided using a shift register and the cutoff of the electric fuse is controlled using an LSI tester.

Another example is a semiconductor device in which electric fuses to be cut off are divided into a plurality of groups and cutoff operations are sequentially performed for each of the groups.

As described above, electric fuses are generally provided in various semiconductor devices and utilized as nonvolatile storage elements for performing various functions. For example, a current of tens of milliamperes is desirably caused to flow through each of such electric fuses for tens of microseconds ($\mu s$) so that the electric fuses may be cut off.

Since the amount of a current that the LSI tester may supply is limited, the number of electric fuses that may be cut off at one time is also limited.

Accordingly, to cut off many electric fuses, the cutoff operations are desirably divided and performed at two or more times, and a current of tens of $\mu s$ is desirably caused to flow through the electric fuses per series of the cutoff operations.

Typically, when two or more electric fuses provided in a semiconductor device are cut off using an LSI tester, the cutoff operations have been desirably divided and performed at two or more times in view of the amount of a current that the LSI tester may supply.

For example, in the electric fuse cutoff control circuit that Japanese Patent Application Laid-Open Publication No. 2006-197272 discusses, electric fuses to be cut off are divided into two or more groups in view of the amount of a current that an LSI tester may supply, cutoff operations are sequentially performed for each of the groups, and the cutoff operations are repeated before the number of electric fuses to be cut off becomes zero.

According to this example, however, since combinations of the electric fuses that may be concurrently cut off are fixed, there may be a case where only one electric fuse is cut off at one time and it takes much time to complete all of the cutoff operations for the electric fuses desired to be cut off.

SUMMARY

According to aspects of an embodiment, an electric fuse cutoff control circuit controlling cutoff of a plurality of electric fuses includes: a cutoff information storage circuit adapted to store cutoff information about whether or not each of the plurality of electric fuses is cut off; a cutoff information control circuit controlling the cutoff of the plurality of electric fuses based on an output signal of the cutoff information storage circuit; and a cutoff information renewal circuit receiving an output signal of the cutoff information control circuit and renewing the cutoff information set for the cutoff information storage circuit.

It is to be understood that both the foregoing summary description and the following detailed description are exemplary and explanatory and are not restrictive of the invention, as claimed. Additional advantages and novel features of aspects of the present invention will be set forth in part in the description that follows, and in part will become more apparent to those skilled in the art upon examination of the following or upon learning by practice thereof.

BRIEF DESCRIPTION OF DRAWINGS

FIG. 7 is a chart for explaining operations of the increment circuit in FIG. 6, in accordance with aspects of the present invention;

FIG. 9 is a chart for explaining operations of the electric fuse cutoff control circuit in FIG. 5, in accordance with aspects of the present invention;

FIG. 13 is a chart for explaining operations of the increment circuit in FIG. 12, in accordance with aspects of the present invention;

DESCRIPTION OF EMBODIMENTS

Prior to describing embodiments of an electric fuse cutoff control circuit and a semiconductor device according to aspects of the present invention in detail, an example of an electric fuse cutoff control circuit according to related art and disadvantages that may be resulted from using the electric fuse cutoff control circuit are described with reference to FIGS. 1 and 2.

Figure 1:
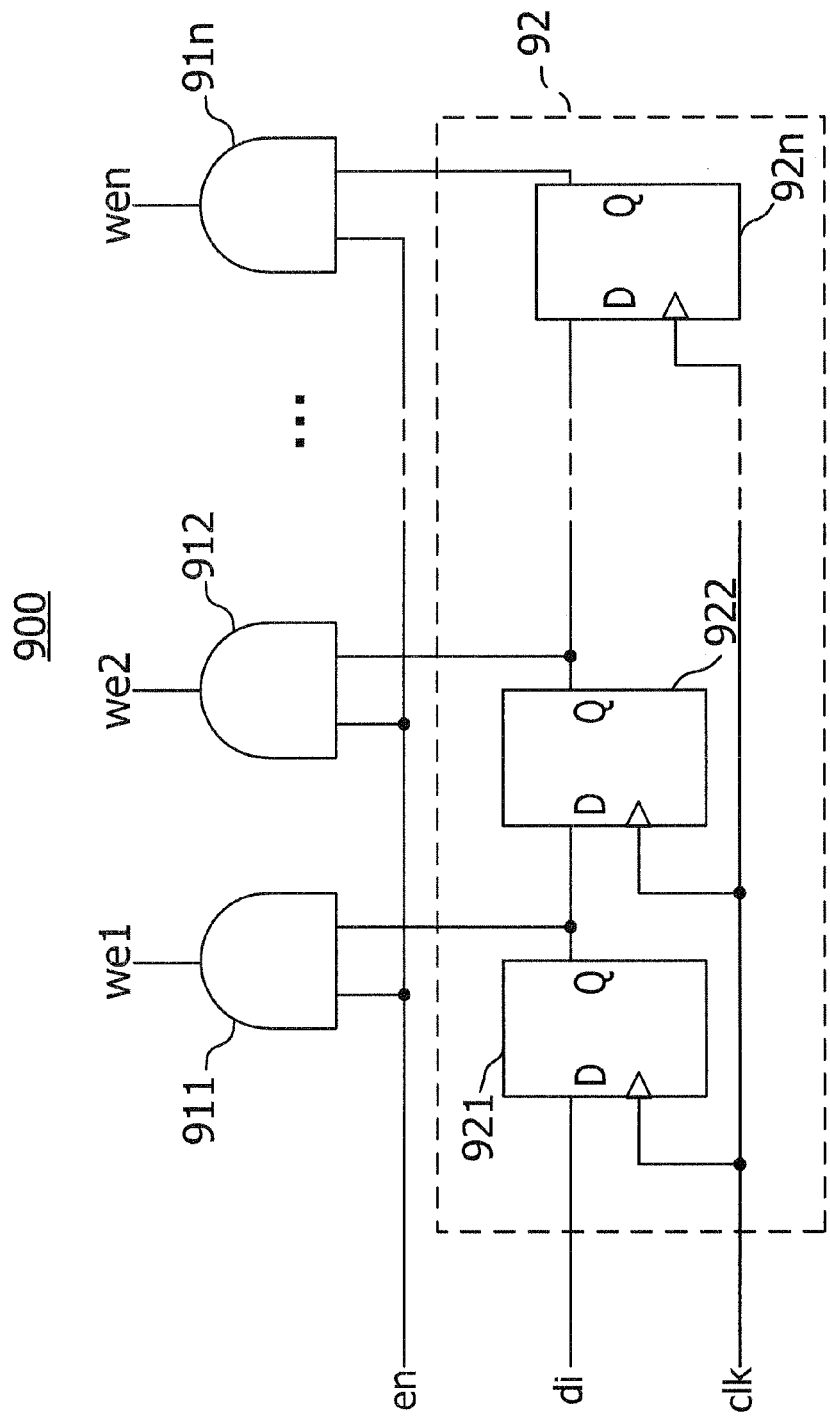
FIG. 1 illustrates an electric fuse cutoff control circuit according to related art.

In FIG. 1, the electric fuse cutoff control circuit 900 operates to cut off n electric fuses, and includes n AND gates 911 to 91$n$ and a shift register 92 that includes n flip flops (resistors) 921 to 92$n$.

A data input terminal D of the flip flop 921 provided at the first stage receives cutoff information di supplied from outside. Each of data input terminals D of the flip flops 922 to 92$n$ provided at the $2^{nd}$ to $n^{th}$ stages is coupled to a data output terminal Q of a corresponding one of the flip flops 921 to 92$n$-1, which is provided at a preceding stage.

An input terminal of each of the AND gates 911 to 91$n$ receives an enable signal en for enabling cutoff operations. The other input terminal of each of the AND gates 911 to 91$n$ receives an output signal from a corresponding one of the flip flops 921 to 92$n$.

The AND gates 911 to 91$n$ output cutoff control signals we1 to wen for controlling whether or not the n electric fuses provided in, for example, a semiconductor device are cut off.

Figure 2:
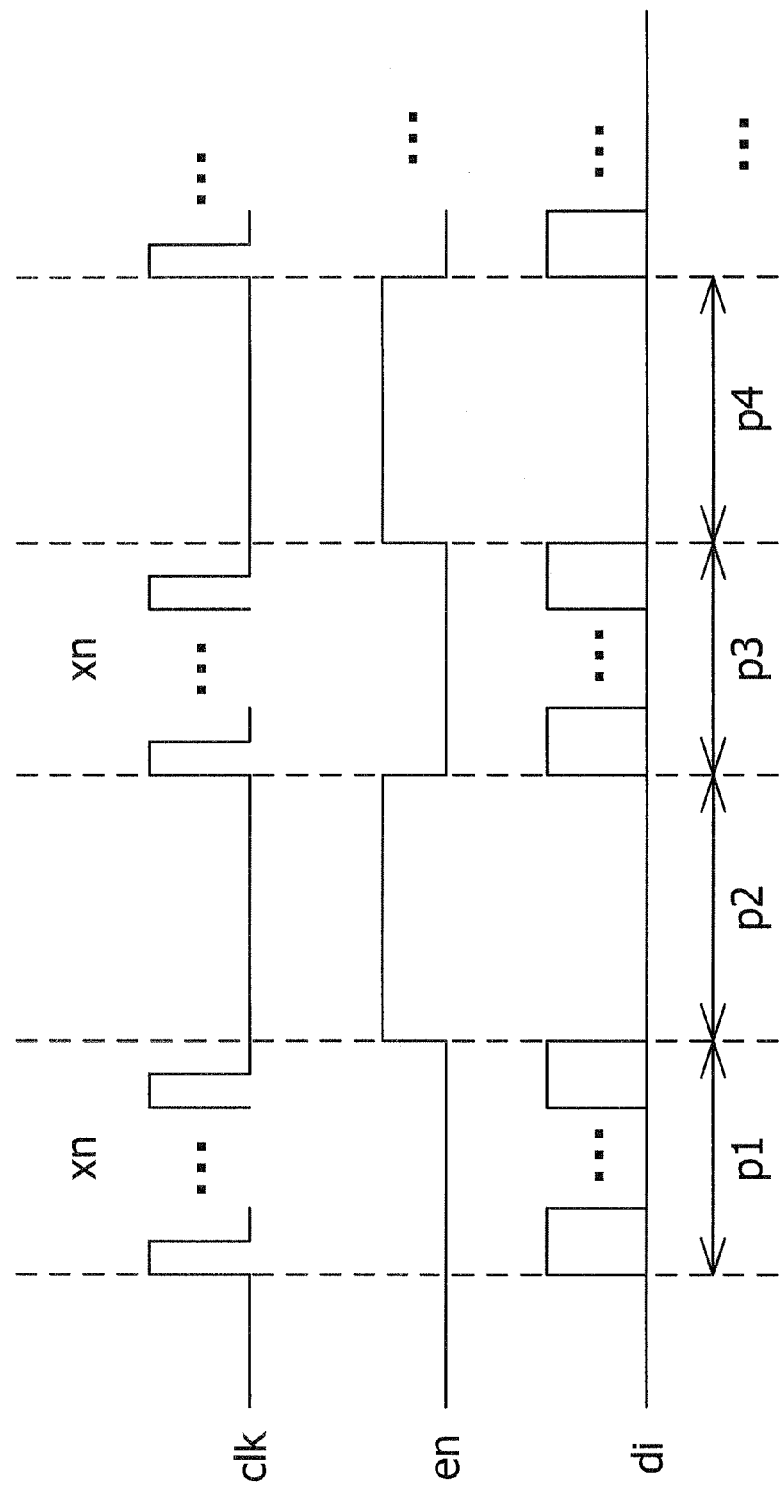
FIG. 2 illustrates a timing chart for explaining a cutoff pattern according to the electric fuse cutoff control circuit in FIG. 1.

FIG. 2 is a timing chart for explaining a cutoff pattern according to the electric fuse cutoff control circuit 900 in FIG. 1.

To simplify the explanation, the total number of electric fuses is set to 120 (n=120), the number of electric fuses to be cut off is set to 50, and the number of electric fuses that may be concurrently cut off using a large scale integration (LSI) tester is set to 10, for example.

In a period p1, the electric fuse cutoff control circuit 900 in FIG. 1 supplies the flip flops 921 to 92$n$ with the cutoff information di indicating that the data "1" is set for the 10 electric fuses, which are included in the 50 electric fuses to be cut off and undergo the concurrent cutoff operations first, and the data "0" is set for the other electric fuses.

That is, in the period p1, the data "1" is set for 10 flip flops corresponding to the 10 electric fuses that are included in the 120 electric fuses and cut off by the first concurrent cutoff operations, and the data "0" is set for the other 110 flip flops.

Accordingly, the data is set for all of the 120 flip flops 921 to 92$n$ based on n clocks clk (n=120) in the period p1.

After that, the cutoff operations are performed in a period p2 so that the enable signal en is caused to rise from a low level ("0") to a high level ("1") and output signals (the cutoff control signals "we") from 10 AND gates, which are included in the AND gates 911 to 91$n$ and correspond to the 10 electric fuses that undergo the first concurrent cutoff operations, are caused to reach "1".

That is, in the period p2, the 10 cutoff control signals "we," which correspond to the 10 electric fuses that may be concurrently cut off using the LSI tester, desirably reach "1" and a current is thereby caused to flow through the 10 electric fuses for a given length of time, such as tens of microseconds (μs). As a result, the 10 electric fuses may be concurrently cut off.

In a period p3, all of the flip flops 921 to 92$n$ are supplied with the cutoff information di indicating that the data "1" is set for other 10 electric fuses, which are included in the 50 electric fuses to be cut off and undergo second concurrent cutoff operations, and the data "0" is set for the other electric fuses.

Similar to the above-described data setting performed in the period p1, the data is set for all of the 120 flip flops 921 to 92$n$ based on the n clocks clk (n=120) in the period p3.

In a period p4, the enable signal en is caused to rise from "0" to "1" and 10 cutoff control signals "we" from ten of the AND gates 911 to 91$n$ corresponding to the ten electric fuses that are cut off in the second concurrent cutoff operations to reach "1."

Similar to the above-described operations performed in the period p3, the 10 electric fuses may be concurrently cut off in the period p4 by causing a current to flow through the 10 electric fuses that may be concurrently cut off using the LSI tester for a given length of time, such as tens of μs.

Similar operations are repeated before completing the total of five series of the cutoff operations by selecting 10 electric fuses, which may be concurrently cut off using the LSI tester, from the 50 electric fuses to be cut off in each series of the cutoff operations and sequentially cutting the selected electric fuses. The number of the electric fuses that may be concurrently cut off using the LSI tester is hereinafter referred to as "the largest concurrent cutoff number."

Thus, the electric fuse cutoff control circuit 900 illustrated in FIG. 1 performs the cutoff operations by, for example, setting (storing) the cutoff information di, which corresponds to the largest concurrent cutoff number for the LSI tester, for (in) the shift register 92 and repeats the cutoff operations before all of the electric fuses to be cut off are cut off.

Since the cutoff information is desirably input many times to cut off many electric fuses using the electric fuse cutoff control circuit 900 in FIG. 1, it takes a long time to complete the electric fuse cutoff operations.

For example, the length of one series of the electric fuse cutoff operations performed in the period p2 or p4 is tens of μs while the typical length of a test cycle of the LSI tester is tens to hundreds of nanoseconds (ns). Accordingly, the number of the cutoff operations is desirably decreased to be as small as possible.

As described above, the electric fuse cutoff control circuit according to the related art may enable the electric fuses corresponding to the largest concurrent cutoff number to be cut off, however, it takes a long time to complete all of the cutoff operations because the cutoff information is desirably input many times. For example, the increase in operating time results in an increase in the time desired for the inputs of the cutoff information as the total number of electric fuses provided in a semiconductor device is increased.

Figure 3:
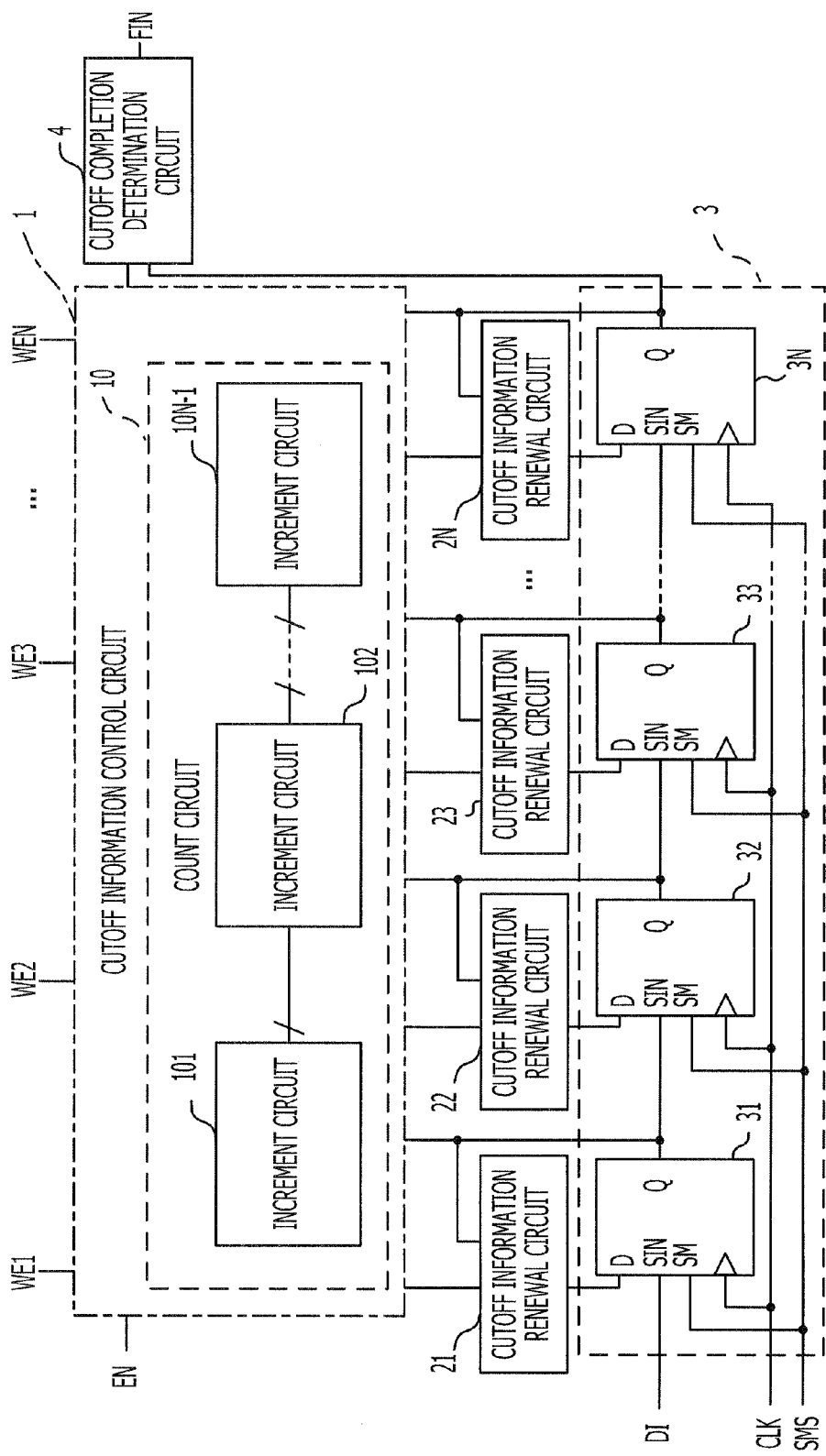
FIG. 3 is a block diagram illustrating an electric fuse cutoff control circuit according to an embodiment, in accordance with aspects of the present invention.

Referring to FIG. 3, an embodiment of an electric fuse cutoff control circuit, in accordance with aspects of the present invention, is described.

FIG. 3 is a block diagram illustrating the electric fuse cutoff control circuit according to the embodiment.

FIG. 3 illustrates a cutoff information control circuit 1, a count circuit 10, cutoff information renewal circuits 21 to 2N, a shift register (cutoff information storage circuit) 3 that includes scan flip flops (SFFs) 31 to 3N, and a cutoff completion determination circuit 4. The character "N" used here indicates the total number of electric fuses provided in, for example, a semiconductor device.

FIG. 3 further illustrates cutoff control signals WE1 to WEN for controlling whether or not corresponding electric fuses are cut off, an enable signal EN for enabling the cutoff operations, and electric fuse cutoff information DI supplied from outside.

As illustrated in FIG. 3, the electric fuse cutoff control circuit according to aspects of the present embodiment includes the cutoff information control circuit 1, the cutoff information renewal circuits 21 to 2N, the SFFs 31 to 3N, and the cutoff completion determination circuit 4.

The cutoff information control circuit 1 includes the count circuit 10 that includes N-1 increment circuits 101 to 10N-1. The SFFs (registers) 31 to 3N set the electric fuse cutoff information DI by scan shift operations.

An input terminal SIN of the SFF 31 provided at the first stage receives the electric fuse cutoff information DI supplied from the outside. Each of input terminals SIN of the SFFs 32 to 3N provided at the $2^{nd}$ to $N^{th}$ stages is coupled to a data output terminal Q of a corresponding one of the SFFs 31 to 3N-1, which is provided at a preceding stage.

When a scan mode signal SMS is supplied to each of scan mode input terminals SM of the SFFs 31 to 3N, the cutoff information DI is set by sequentially shifting in accordance with a clock signal CLK.

The data output terminals Q of the SFFs 31 to 3N are coupled to the cutoff information control circuit 1. Each of the data output terminals Q of the SFFs 31 to 3N is coupled to a corresponding one of the cutoff information renewal circuits 21 to 2N.

Each of the cutoff information renewal circuits 21 to 2N receives a cutoff information signal supplied from the cutoff information control circuit 1.

In the electric fuse cutoff control circuit according to aspects of the present embodiment, the setting of the cutoff information DI is performed for the SFFs 31 to 3N one time, and the cutoff information is sequentially renewed by the cutoff information renewal circuits 21 to 2N. When the cutoff operations are completed, a cutoff completion signal FIN of the cutoff completion determination circuit 4 changes.

Figure 4:
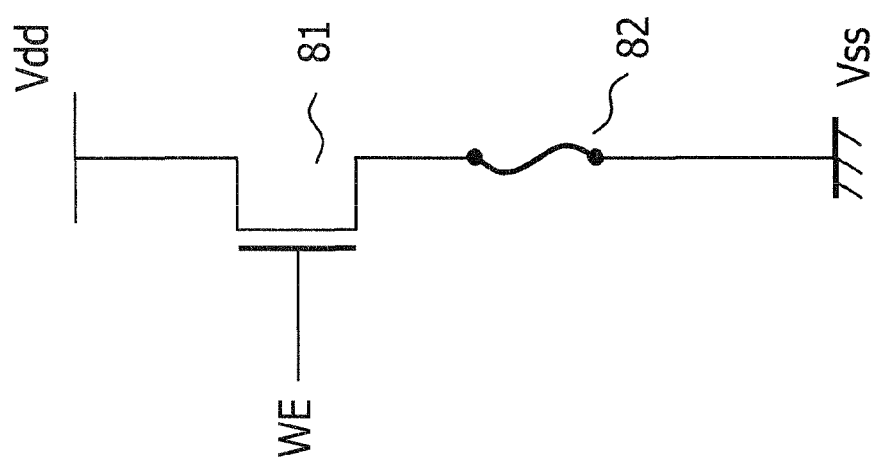
FIG. 4 is a circuit diagram illustrating an electric fuse and a cutoff circuit, in accordance with aspects of the present invention.

FIG. 4 is a circuit diagram illustrating an electric fuse 82 and a cutoff circuit.

As illustrated in FIG. 4, cutoff of the electric fuse 82 is controlled by the cutoff circuit including an N-channel MOS transistor 81 that is coupled to the electric fuse 82 in series.

That is, when a signal at a high level ("1") is applied to the gate of the transistor 81, the transistor 81 turns on and a current flows through the electric fuse 82, and the electric fuse 82 is cut off.

FIG. 4 merely depicts one example and other variations are conceivable. For example, the transistor 81 may be a P-channel MOS transistor, and/or the coupling order of the cutoff circuit and the electric fuse 82 may be reversed between a high potential side Vdd and a low potential side Vss.

When the transistor 81 is a P-channel transistor, logic of a cutoff control signal WE is reversed. The "on" and "off" states of the cutoff circuit (transistor 81) is controlled based on the cutoff control signal WE. When the cutoff circuit (transistor 81) turns on, the electric fuse 82 is cut off.

The embodiments of the electric fuse cutoff control circuit and the semiconductor device according to aspects of the present application are described in detail below.

Figure 5:
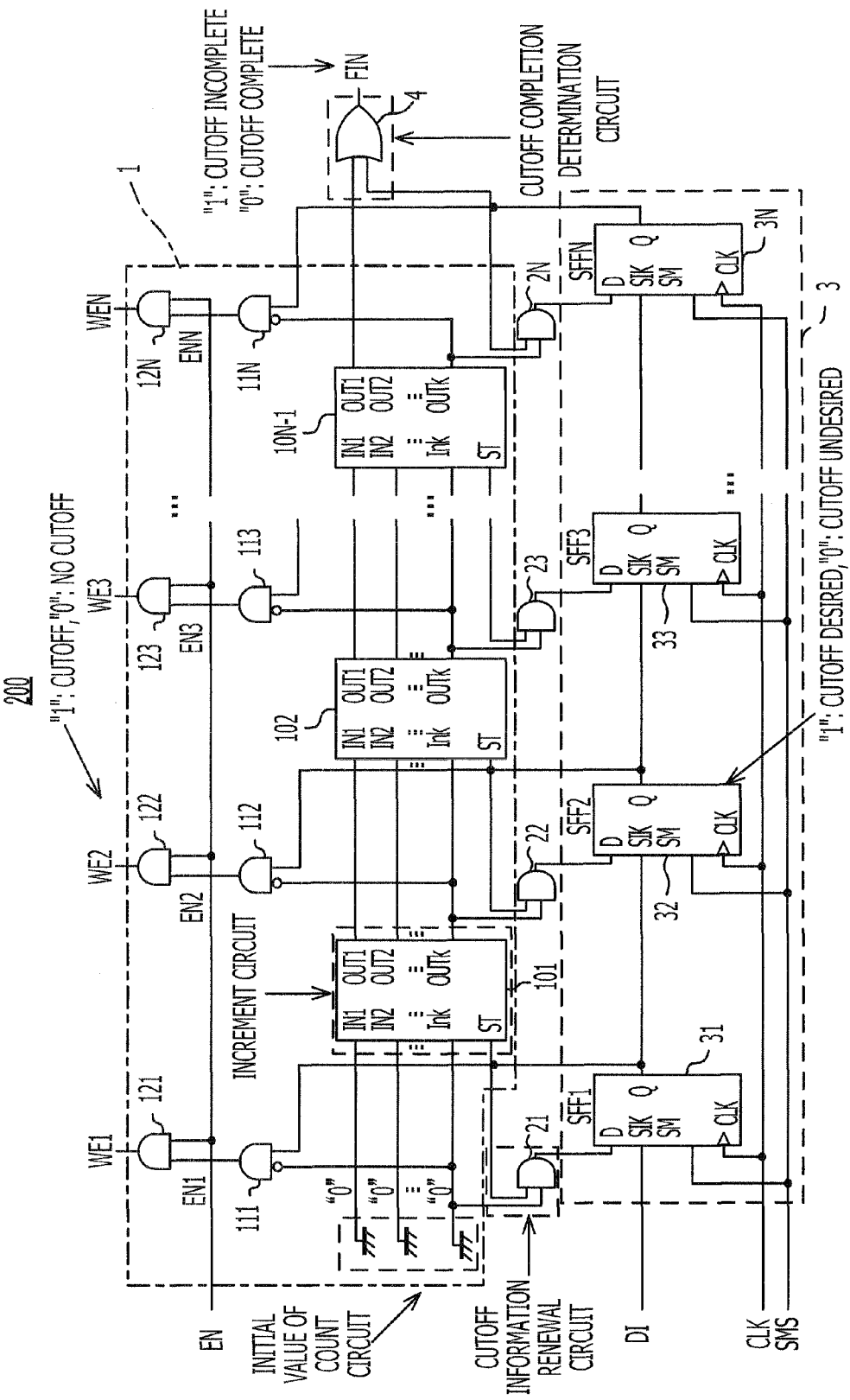
FIG. 5 is a circuit diagram illustrating an electric fuse cutoff control circuit according to Embodiment 1, in accordance with aspects of the present invention.

FIG. 5 is a circuit diagram illustrating an electric fuse cutoff control circuit 200 according to Embodiment 1.

As illustrated in FIG. 5, the electric fuse cutoff control circuit 200 according to Embodiment 1 includes a cutoff information control circuit 1, cutoff information renewal circuits 21 to 2N, a shift register (cutoff information storage circuit) 3 that includes SFFs (registers) 31 to 3N (hereinafter, including the accompanying drawings, referred to also as "SFF1 to SFFN," respectively), and a cutoff completion determination circuit 4. The character "N" used here indicates the total number of electric fuses provided in, for example, a semiconductor device.

The cutoff information control circuit 1 includes N-1 increment circuits 101 to 10N-1, N two-input AND gates 111 to 11N, and N two-input AND gates 121 to 12N. The N-1 increment circuits 101 to 10N-1 correspond to the count circuit 10 described above with reference to FIG. 3.

Each of the increment circuits 101 to 10N-1 includes k input terminals IN1 to INk, an input terminal ST, and k output terminals OUT1 to OUTk. The character "k" used here indicates the number of electric fuses that may be concurrently cut off using, for example, an LSI tester.

As illustrated in FIG. 5, an inverting input terminal of the AND gate 111 provided at the first stage is grounded, and the other input terminal of the AND gate 111 is coupled to a data output terminal Q of the corresponding SFF 31.

An inverting input terminal of each of the AND gates 112 to 11N provided at the $2^{nd}$ to $N^{th}$ stages is coupled to the output terminal OUTk of a corresponding one of the increment circuits 102 to 10N-1, which is provided at a preceding stage. The other input terminal of each of the AND gates 112 to 11N is coupled to a data output terminal Q of a corresponding one of the SFFs 32 to 3N.

An input terminal of each of the AND gates 121 to 12N is coupled to an output terminal of a corresponding one of the AND gates 111 to 11N. The other input terminal of each of the AND gates 121 to 12N receives an enable signal EN.

Output signals WE1 to WEN of the AND gates 121 to 12N operate as gate signals for the transistors (cutoff circuits) 81, one of which is described above with reference to FIG. 4, and as cutoff control signals for controlling whether or not N corresponding electric fuses 82, one of which is also described above with reference to FIG. 4, are cut off.

All of the input terminals IN1 to INk of the increment circuit 101 provided at the first stage are grounded, and an initial value "0" of a count circuit is set for each of the input terminals IN1 to INk.

The input terminals IN1 to INk of each of the increment circuits 102 to 10N-1 that are provided at the $2^{nd}$ to N-1$^{th}$ stages are coupled to the output terminals OUT1 to OUTk of a corresponding one of the increment circuits 101 to 10N-2, which is provided at a preceding stage, respectively.

The output terminal OUT1 of the increment circuit 10N-1 provided at the final (N-1$^{th}$) stage is coupled to an input terminal of an OR gate, which operates as the cutoff completion determination circuit 4, and the output terminal OUTk of the increment circuit 10N-1 provided at the final stage is coupled to the inverting input terminal of the AND gate 11N.

The output terminals OUT2 to OUTk-1 of the increment circuit 10N-1 provided at the final stage is not coupled to any of the terminals or elements.

Each of the input terminals ST of the increment circuits 101 to 10N-1 is coupled to the data output terminal Q of a corresponding one of the SFFs 31 to 3N.

The outputs from each of the increment circuits 101 to 10N-1 indicates the number of SFFs for which "1" is set, which are included between the SFF 31 provided at the first stage and a corresponding one of the SFFs 31 to 3N-1 inclusive, when "1" implies that the electric fuses corresponding to the SFFs for which "1" is set are desired to be cut off, and to be exact, indicates the number obtained by adding the initial value of the count circuit to the aforementioned number.

For example, the number of outputs from the increment circuit 102 indicates the number of the SFFs for which "1" is set, which are included between the SFF 31 and the SFF 32 inclusive.

Referring to FIG. 5, the cutoff information renewal circuits 21 to 2N and the SFFs 31 to 3N are arranged to the N electric fuses provided in the semiconductor device.

The input terminal SIN of the SFF 31 provided at the first stage is supplied with the cutoff information DI. The input terminal SIN of each of the SFFs 32 to 3N provided at the $2^{nd}$ to N$^{th}$ stages is coupled to the data output terminal Q of a corresponding one of the SFFs 31 to 3N-1, which is provided at a preceding stage.

When the terminal SM of each of the SFFs 31 to 3N is supplied with the scan mode signal SMS and the scan mode is set, the electric fuse cutoff information DI sequentially shifts in accordance with the clock signal CLK and is set for the SFFs 31 to 3N.

The data output terminal Q of each of the SFFs 31 to 3N is coupled to the cutoff information control circuit 1 and coupled also to a corresponding one of the cutoff information renewal circuits 21 to 2N.

For example, when "1" is set for the SFF 31 provided at the first stage, the enable signal EN1 output from the AND gate 111 reaches "1" and the corresponding electric fuse is actually cut off.

When "1" is set for a SFF 3X (X=2 to N), and the number of SFFs for which "1" is set among SFFs 31 to 3X-1 is smaller than the largest concurrent cutoff number, the enable signals ENX reaches "1" and the corresponding electric fuse is actually cut off.

The output from the output terminal OUTk of an increment circuit 10x(X=1 to N-1) determines whether or not the number of SFFs for which "1" is set among SFFs 31 to 3X+1 reaches the largest concurrent cutoff number.

For example, when "1" is set for the SFF 34, and the number of SFFs for which "1" is set, which are included in the SFFs 31 to 33, is smaller than the largest concurrent cutoff number, the enable signal EN4 reaches "1" and the corresponding electric fuse is actually cut off.

The output from the output terminal OUTk of the increment circuit 103 determines whether or not the number of SFFs for which "1" is set, which are included in the SFFs 31 to 33, reaches the largest concurrent cutoff number.

The cutoff information renewal circuits 21 to 2N-1 may be two-input AND gates (hereinafter referred to also as AND gates 21 to 2N-1). An input terminal of the AND gate 21 provided at the first stage is grounded. The other input terminal of the AND gate 21 is coupled to the data output terminal Q of the corresponding SFF 31.

An input terminal of each of the AND gates 22 to 2N provided at the $2^{nd}$ to N$^{th}$ stages is coupled to the output terminal OUTk of a corresponding one of the increment circuits 101 to 10N-1, which is provided at a preceding stage. The other input terminal of each of the AND gates 22 to 2N is coupled to the data output terminal Q of a corresponding one of the SFFs 32 to 3N.

The output terminal of each of the AND gates 21 to 2N is coupled to the data input terminal D of a corresponding one of the SFFs 31 to 3N.

As described above, the values of the SFFs corresponding to the electric fuses desired to be cut off are "1," and the values of the outputs from cutoff information renewal circuits (AND gates) corresponding to k electric fuses that are actually cut off reach "0." Accordingly, the values for the SFFs that receive the outputs as inputs at the data input terminals D are renewed from "1" to "0" based on the input of the clock signal CLK. As a result, the corresponding electric fuses are undesired to be cut off after that.

The values of the outputs from the cutoff information renewal circuits corresponding to the electric fuses other than the k electric fuses, which are included in the electric fuses desired to be cut off and are actually cut off, reach "1," and the values of the SFFs that receive the outputs as inputs at the data input terminals D reach "1" and remain unchanged. That is, the corresponding electric fuses remain desired to be cut off.

The values of the SFFs corresponding to the electric fuses undesired to be cut off are "0," the values of the outputs from the corresponding cutoff information renewal circuits reach "0," and the values of the SFFs that receive the outputs as inputs at the data input terminals D reach "0" and remain unchanged.

Thus, when the values of the SFFs are renewed, the output of the cutoff information control circuit including the increment circuits changes and the k electric fuses that are subsequently cut off are determined, and the subsequent cutoff operations are performed for the determined k electric fuses.

Concurrently, the output of each of the cutoff information renewal circuits changes as well. After the completion of the cutoff operations of the electric fuses, the clock signal CLK is input to each SFF to renew the value of the SFF. The electric fuses desired to be cut off may be all cut off by repeating the operations described above.

For example, the total number of electric fuses is set to 120 (N=120), the number of electric fuses to be cut off is set to 50, and the number of electric fuses that may be concurrently cut off using the LSI tester is set to 10.

In the electric fuse cutoff control circuit 200 according to Embodiment 1, information on the 50 electric fuses to be cut off is written in the N SFF 31 to 3N (N=120) without being changed.

The setting (writing) of the cutoff information DI for (in) the SFFs 31 to 3N is preferably performed one time and, unlike in the electric fuse cutoff control circuit illustrated in FIG. 1, setting 10 electric fuses, which may be concurrently cut off using the LSI tester, per series of the cutoff operations is undesired.

That is, in the electric fuse cutoff control circuit 200 according to Embodiment 1, the cutoff information that has been set is renewed by the cutoff information renewal circuits 21 to 2N every time 10 electric fuses that may be concurrently cut off are cut off.

When the cutoff operations for the final 10 electric fuses are completed, the cutoff completion determination circuit 4 outputs the cutoff completion signal FIN at the low level ("0").

In Embodiment 1, the cutoff completion determination circuit 4 may be a two-input OR gate coupled to the output terminals OUT1 and OUTk of the increment circuit 10N-1 provided at the final stage. This utilizes that both signals from the output terminals OUT1 and OUTk of the increment circuit 10N-1 at the final stage reach "0" when the cutoff operations are completed for all of the 50 electric fuses to be cut off.

Figure 6:
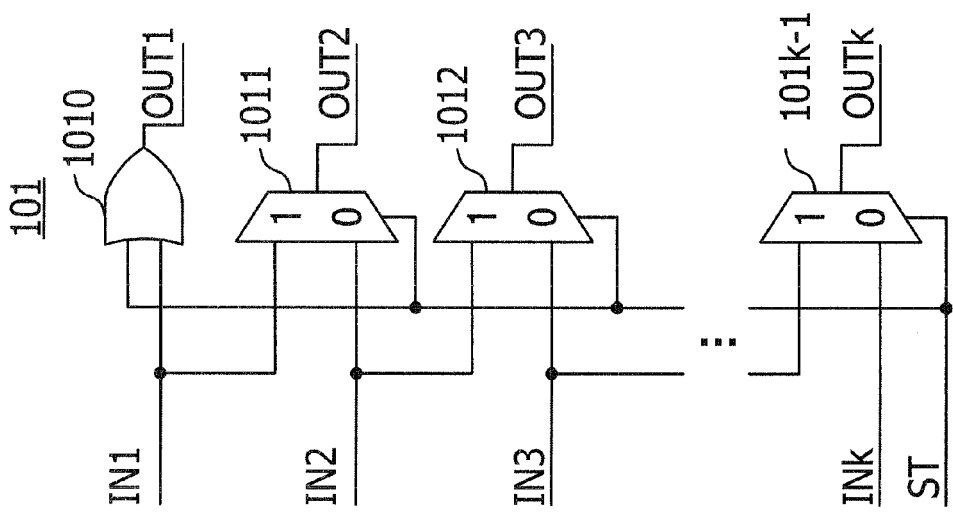
FIG. 6 illustrates an increment circuit in the electric fuse cutoff control circuit in FIG. 5, in accordance with aspects of the present invention.

FIG. 6 illustrates an increment circuit in the electric fuse cutoff control circuit 200 in FIG. 5. Since all of the increment circuits 101 to 10N-1 are substantially the same, FIG. 6 depicts the increment circuit 101 as an example.

As illustrated in FIG. 6, the increment circuit 101 includes k-1 selectors 1011 to 101k-1 and an OR gate 1010 when the largest number of electric fuses that may be concurrently cut off using the LSI tester is "k."

An input terminal of the OR gate 1010 is supplied with output data of the SFF 31, which is input through the input terminal ST, and the other input terminal of the OR gate 1010 is supplied with data indicating the initial value of "0," which is input through the input terminal IN1.

An input terminal of each of the selectors 1011 to 101k-1 is supplied with a corresponding one of signals input to the input terminals IN1 to INk-1. The other input terminal of each of the selectors 1011 to 101k-1 is supplied with a subsequent one of the signals, which are input to the input terminals IN2 to INk-1, and a signal input to the input terminal INk. After that, one of the two input signals is selected and output from each of the output terminals OUT2 to OUTk in accordance with the output data of the SFF 31. The output terminal OUT1 outputs an output signal of the OR gate 1010.

FIG. 7 is a chart for explaining operations of the increment circuit 101 in FIG. 6. FIG. 7 illustrates the input data of the input terminals IN1 to INk and the output data of the output terminals OUT1 to OUTk, which may be obtained when the logic of the input terminal ST is "0" or "1."

FIG. 7 depicts the input data of the input terminals IN1 to INk and the output data of the output terminals OUT1 to OUTk in the order from a most significant bit (MSB) to a least significant bit (LSB).

As illustrated in FIGS. 6 and 7, when the logic of the input terminal ST, that is, an output signal of the SFF 31 is "0," the increment circuit 101 outputs the data supplied to the input terminals IN1 to INk from the output terminals OUT1 to OUTk without changing the data. As a result, when the logic of the input terminal ST is "0," the output value equals the input value, and the output value is not incremented, that is, remains unchanged from "XXX . . . XXX." Hereinafter, the signal output from the output terminal Q of each SFF is referred to also as a "Q output."

When the logic of the input terminal ST is "1," the increment circuit 101 increments the data supplied to the input terminals IN1 to INk by one and outputs the incremented data from the output terminals OUT1 to OUTk. As a result, when the logic of the input terminal ST is "1," the equation "the output value=the input value+1" may be satisfied and the output value may be incremented.

As illustrated in FIG. 7, the input value "000 . . . 000" of the input terminals IN1 to INk corresponds to "the count value=0," and the input value "011 . . . 111" of the input terminals IN1 to INk corresponds to "the count value=k−1."

Figure 8:
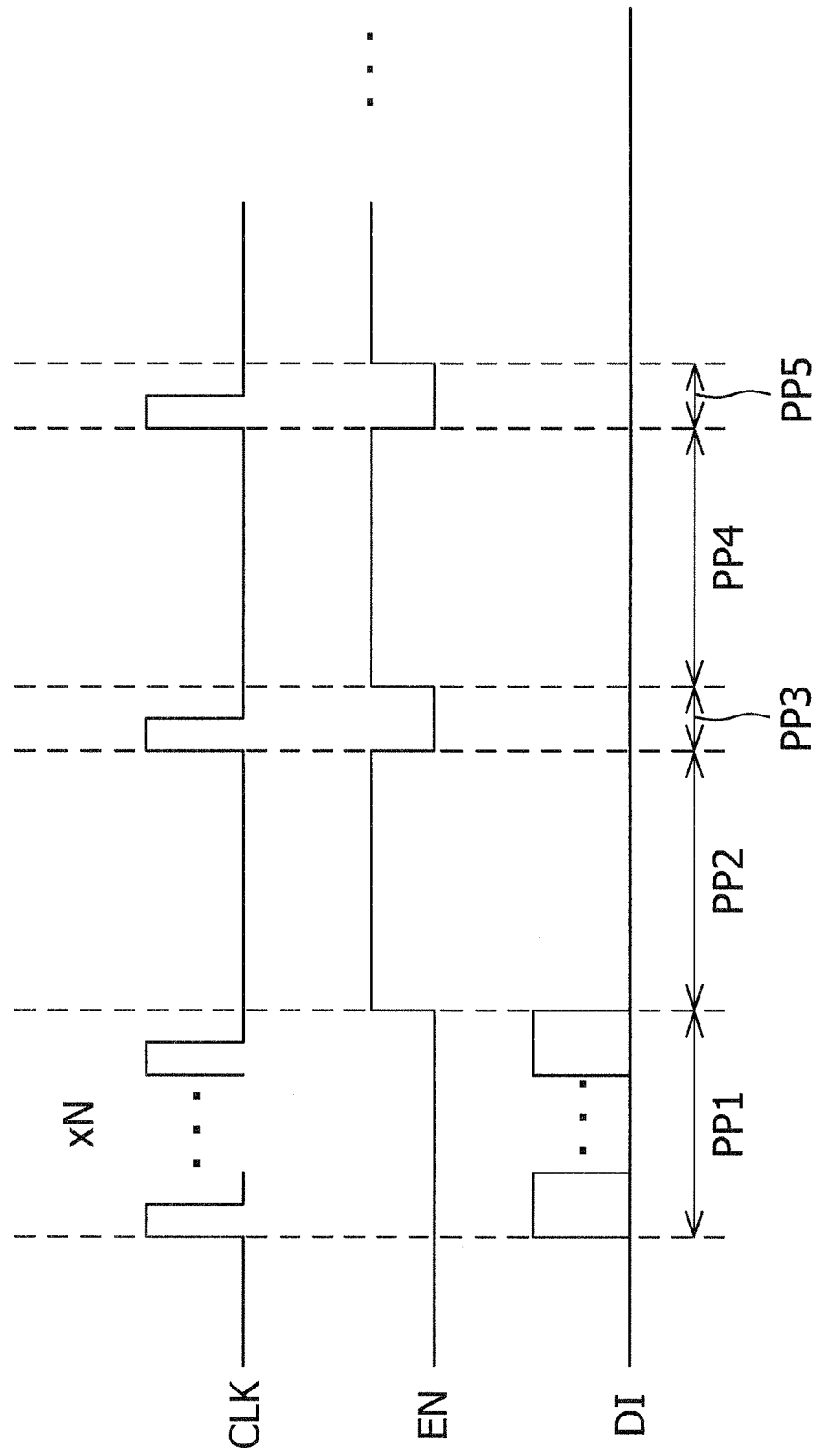
FIG. 8 is a timing chart for explaining a cutoff pattern according to the electric fuse cutoff control circuit in FIG. 5, in accordance with aspects of the present invention.

FIG. 8 is a timing chart for explaining a cutoff pattern according to the electric fuse cutoff control circuit 200 in FIG. 5.

To simplify the explanation, similar to the explanation for FIG. 2, the total number of electric fuses is set to 120 (N=120), the number of electric fuses to be cut off is set to 50, and the number of electric fuses that may be concurrently cut off using the LSI tester is set to 10 for example.

The electric fuse cutoff control circuit 200 illustrated in FIG. 5 supplies the cutoff information DI, which includes all information on the 50 electric fuses to be cut off, to the SFFs 31 to 3N in a period PP1.

That is, for example, "1" is set for the SFFs corresponding to the 50 electric fuses desired to be cut off, and "0" is set for the SFFs corresponding to the other 70 electric fuses undesired to be cut off.

As described above, in the electric fuse cutoff control circuit 200 according to Embodiment 1, the setting (writing) of the cutoff information DI for (in) the SFFs 31 to 3N is preferably performed one time.

In a period PP2, the cutoff operations are performed so that the enable signal EN is caused to rise from "0" to "1," and the output signals (cutoff control signals WE) from the AND gates included in the AND gates 111 to 11N and corresponding to the 10 electric fuses that undergo the concurrent cutoff operations first are caused to be "1."

Since all of the input terminals IN1 to INk of the increment circuit 101 provided at the first stage are initialized to be "0," k cutoff control signals (k=10), which correspond to the electric fuses that are cut off in the first cutoff operations and are output on the side of the cutoff control signal WE1 (the LSB side), reach "1" and the other cutoff control signals reach "0."

In the operations performed in the period PP2, the cutoff control signals corresponding to the 10 electric fuses, which are provided on the LSB side and may be concurrently cut off using the LSI tester, reach "1" to cause a current to flow for a given length of time (for example, for tens of µs), and the 10 electric fuses are concurrently cut off accordingly.

That is, the electric fuses are cut off in the period PP2 in view of the largest concurrent cutoff number. The output signals of k AND gates of the cutoff information renewal circuits corresponding to the electric fuses that are actually cut off reach "0" when the k AND gates are included in the AND gates 21 to 2N.

In a period PP3, when the clock signal CLK is input, the data (cutoff information) of the SFFs 31 to 3N is renewed and the Q outputs of the SFFs corresponding to the electric fuses that are cut off change to "0."

In a period PP4, the cutoff control signals corresponding to the 10 electric fuses on the LSB side of the 40 remaining electric fuses desired to be cut off, reach 1.

That is, operations similar to those in the period PP2 are performed in the period PP4. For example, the cutoff control signals corresponding to the 11$^{th}$ to 20$^{th}$ electric fuses, which are obtained when the 50 electric fuses desired to be cut off are counted from the LSB side, reach "1," and the 10 electric fuses undergo the cutoff operations.

In a period PP5, similar to the operations performed in the period PP3, the data of the SFFs 31 to 3N is renewed based on the input of the clock signal CLK, and signals input to the input terminals D of the SFFs corresponding to the electric fuses that have been cut off reach "1" and the Q outputs of the SFFs reach "0."

When all of the cutoff operations for cutting off the 50 electric fuses desired to be cut off are completed by repeating the operations performed in the periods (patterns) PP2 and PP4, and PP3 and PP5, both of the signals input to the cutoff completion determination circuit (OR gate) 4 reach "0" and the cutoff completion signal FIN at the "0" level is output.

Advantages of Embodiment 1 are described below using a detailed example. In the example, the total number N of electric fuses provided in the semiconductor device are set to 1000, the number of electric fuses to be cut off is set to 200, and the largest concurrent cutoff number k for the electric fuses is set to 10.

Further, the length of time for cutting off the electric fuses is set to 50 μs and the length of time for renewing the SFFs 31 to 3N, that is, the length of one cycle of the clock signal CLK is set to 100 ns for example.

In the electric fuse cutoff control circuit 900 according to the related art, which is illustrated in FIG. 1, the following equation where "ms" indicates millisecond(s) is satisfied when the number of flip flops is set to 1000 for example:

(1000×100 ns+50 μs)×200÷10=3 ms.

According to Embodiment 1, however, since the number of flip flops (SFFs) is set to 1000 and the 200 electric fuses to be cut off are concurrently cut off by 10 in each series of the cutoff operations, the following equation is satisfied:

1000×100 ns+(50 μs+100 ns)×200÷10=1.102 ms.

Thus, the electric fuse cutoff control circuit according to Embodiment 1 may reduce much time in comparison to the electric fuse cutoff control circuit according to the related art. The advantages of reducing time for the electric fuse cutoff control are similar to those that may be obtained in Embodiments 2 to 7 described below.

FIG. 9 is a chart for explaining operations of the electric fuse cutoff control circuit 200 in FIG. 5 and illustrates values and operations of each signal, which correspond to the periods (hereinafter referred to also as patterns) PP1 to PP5.

FIG. 9 illustrates the operations of the electric fuse cutoff control circuit 200, which are performed when the largest concurrent cutoff number is 2, the total number of electric fuses is 12, and the cutoff information ordered from the LSB to the MSB is "0100 0100 1000" implying that the electric fuses corresponding to the $2^{nd}$, $6^{th}$, and $9^{th}$ bits are cut off.

As illustrated in FIG. 9, in the pattern PP1, the enable signal EN is "0" and the value "0100 0100 1000" is set for the SFFs 31 to 3N (SFF1 to SFF12) so that the electric fuses corresponding to the $2^{nd}$, $6^{th}$, and $9^{th}$ bits are cut off. That is, the cutoff information DI about all of the electric fuses is written in the SFFs SFF1 to SFF12 by scan-in operations in the pattern PP1.

In the pattern PP2, the enable signal EN changes to "1" and the cutoff operations are enabled to be performed, and the values of the cutoff control signals WE1 to WE12 output from the AND gates 121 to 12N change to "0100 0100 0000" and the two electric fuses corresponding to the $2^{nd}$ and $6^{th}$ bits are cut off. That is, the number of bits corresponding to the electric fuses that are concurrently cut off is equal to the largest concurrent cutoff number, and the number of bits in this example is two.

In the pattern PP3, the values that have been set for the SFFs SFF1 to SFF12 are renewed to be "0000 0000 1000" so that the electric fuse corresponding to the $9^{th}$ bit may be cut off.

Accordingly in the pattern PP3, since the two electric fuses corresponding to the $2^{nd}$ and $6^{th}$ bits have been cut off in the first cutoff operations in the pattern PP2, the data corresponding to the two electric fuses changes from "1" to "0," and the data of the electric fuse corresponding to the $9^{th}$ bit, which has not yet been cut off, remains "1."

In the pattern PP4, the enable signal EN changes to "1" again and the cutoff operations are enabled to be performed, and the values of the cutoff control signals WE1 to WE12 output from the AND gates 121 to 12N change to "0000 0000 1000." As a result, the electric fuse corresponding to the $9^{th}$ bit is cut off.

In the pattern PP5, the values that have been set for the SFFs SFF1 to SFF12 are renewed to be "0000 0000 0000." Consequently, the cutoff completion signal FIN changes from "1" to "0" and thereby notifies that the cutoff of all of the electric fuses desired to be cut off (in this example, the electric fuses corresponding to the $2^{nd}$, $6^{th}$, and $9^{th}$ bits) is completed.

The cutoff completion signal FIN is notified to, for example, the LSI tester. Upon recognizing that all of the desired electric fuse cutoff operations are completed, the LSI tester performs subsequent operations, such as checking operations, for the semiconductor device.

Figure 10:
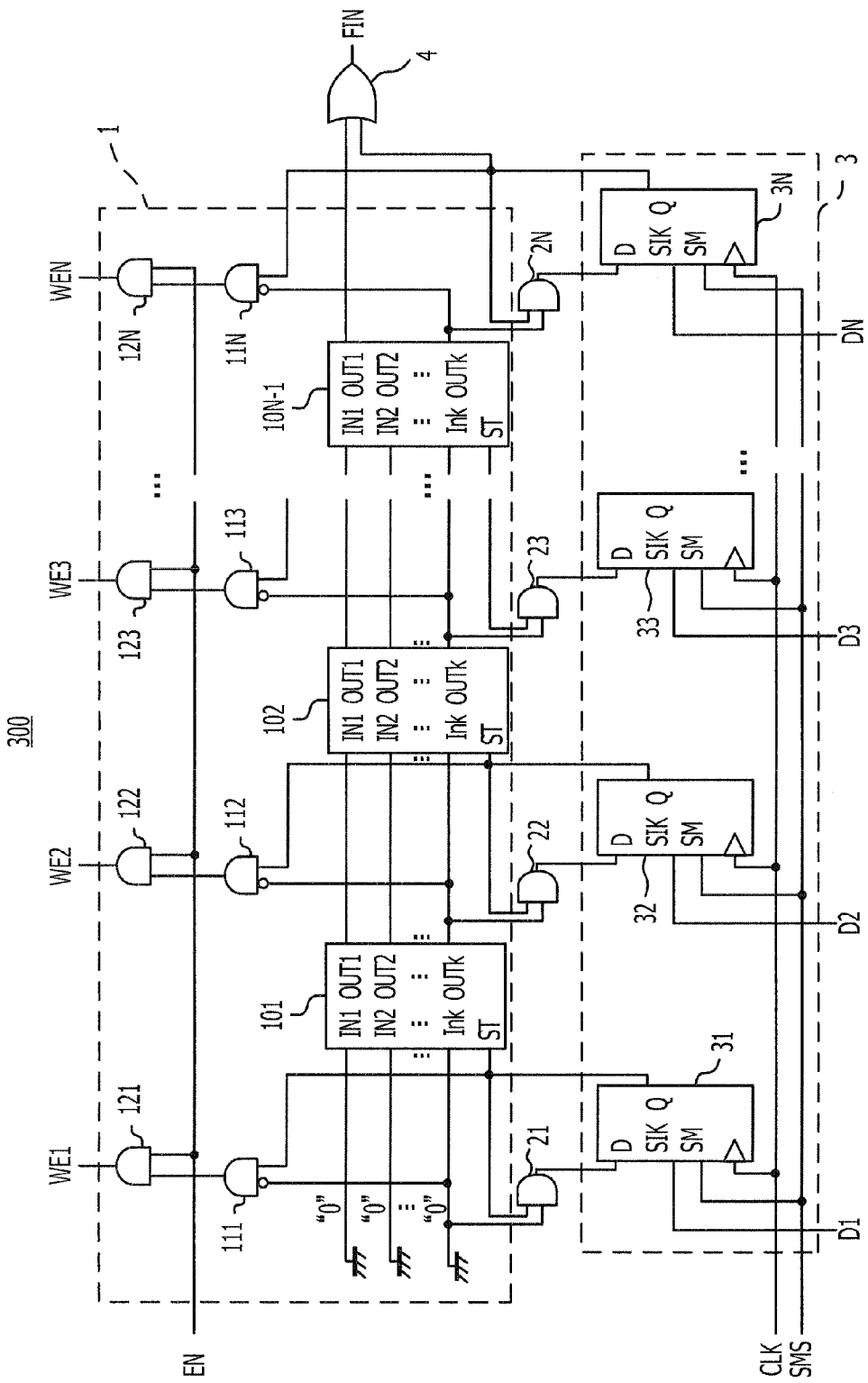
FIG. 10 is a circuit diagram illustrating an electric fuse cutoff control circuit according to Embodiment 2, in accordance with aspects of the present invention.

FIG. 10 is a circuit diagram illustrating an electric fuse cutoff control circuit 300 according to Embodiment 2.

As illustrated in FIG. 10, the electric fuse cutoff control circuit 300 according to Embodiment 2 is configured so that cutoff information D1 to DN is written in SFFs 31 to 3N, respectively, without writing the electric fuse cutoff information DI by the scan shift operations.

That is, the electric fuse cutoff control circuit 300 is configured so that the writing (setting) of the cutoff information may be performed, depending on whether or not the electric fuses are desired to be cut off, by directly supplying the cutoff information D1 to DN indicating "1" to input terminals SIN of given ones of the SFFs 31 to 3N, which correspond to the electric fuses desired to be cut off, and directly supplying the cutoff information D1 to DN indicating "0" to input terminals SIN of the other ones of the SFFs 31 to 3N, which correspond to the electric fuses undesired to be cut off.

For example, when the cutoff information D1 to DN is generated in the semiconductor device, the electric fuse cutoff control circuit 300 according to Embodiment 2 may set the cutoff information for the SFFs 31 to 3N in a short time, thus reducing much more time.

For example, the electric fuse cutoff control circuit 300 according to Embodiment 2 may be used when a memory including a defective portion is replaced with a redundant memory as a result of a memory test, the data on the defective portion, which is obtained by the memory test, is held in the memory including the defective portion and the held data is utilized without being changed as electric fuse cutoff information for the replacement with the redundant memory.

Figure 11:
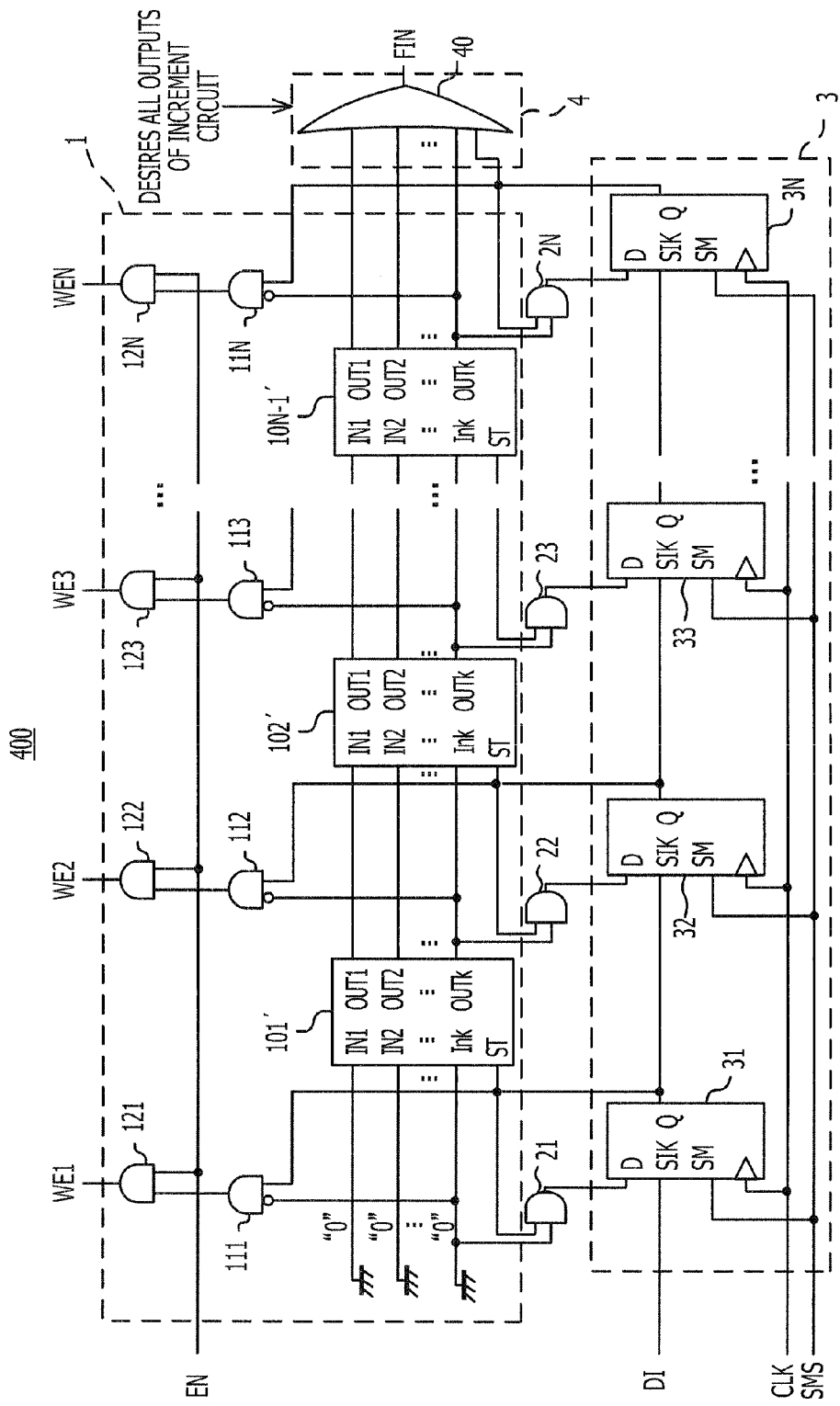
FIG. 11 is a circuit diagram illustrating an electric fuse cutoff control circuit according to Embodiment 3, in accordance with aspects of the present invention.
Figure 12:
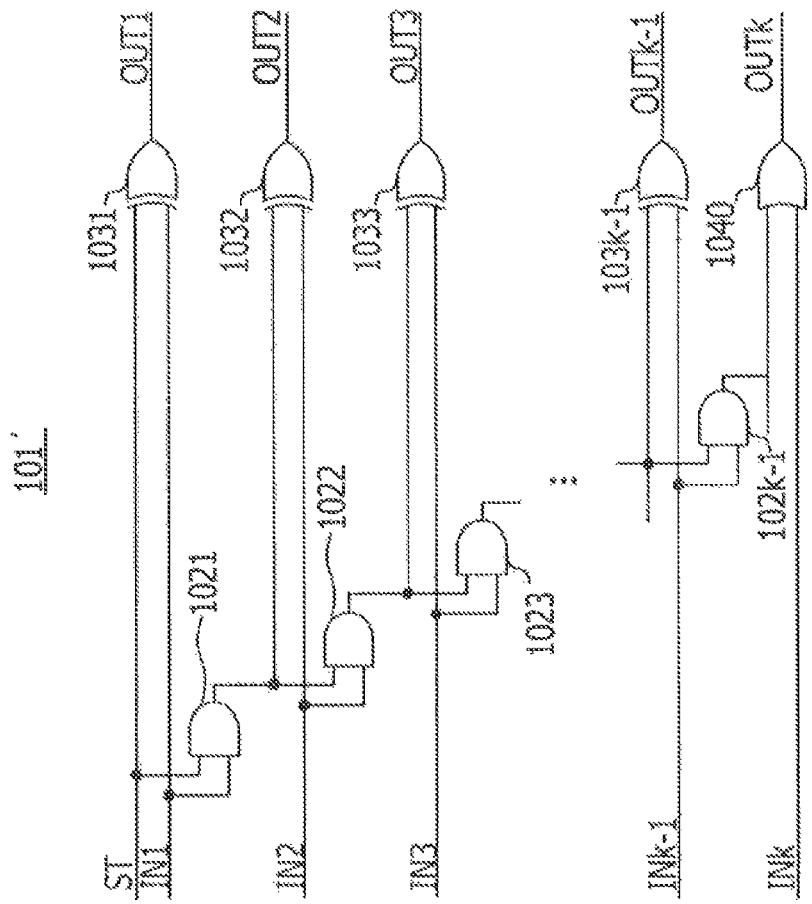
FIG. 12 illustrates an increment circuit in the electric fuse cutoff control circuit in FIG. 11, in accordance with aspects of the present invention.

FIG. 11 is a circuit diagram illustrating an electric fuse cutoff control circuit 400 according to Embodiment 3. FIG. 12 illustrates an increment circuit in the electric fuse cutoff control circuit 400 in FIG. 11.

The electric fuse cutoff control circuit 400 according to Embodiment 3 utilizes an increment circuit 101' that FIG. 12 illustrates by representing input and output values in binary. The maximum concurrent cutoff number for the electric fuse cutoff control circuit 400 according to Embodiment 3 is represented by $2^{(k-1)}$.

When the largest concurrent cutoff number is larger, the increment circuit is larger in size. However, the electric fuse cutoff control circuit according to Embodiment 3 may reduce a possible increase of the circuit size that is dependent on the largest concurrent cutoff number more than the electric fuse cutoff control circuit 200 according to Embodiment 1.

That is, for example, the size of the electric fuse cutoff control circuit 200 according to Embodiment 1 increases in proportion to the largest concurrent cutoff number. However, the size of the electric fuse cutoff control circuit 400 according to Embodiment 3 increases approximately in proportion to $\log_2$ (the largest concurrent cutoff number).

Referring to FIG. 11, the increment circuit 101' is substantially the same as increment circuits 102' to 10N-1'. FIG. 12 depicts the increment circuit 101' as an example.

As illustrated in FIG. 11, a cutoff completion determination circuit 4 in the electric fuse cutoff control circuit 400 according to Embodiment 3 includes an OR gate 40 that includes k input terminals. The OR gate 40 may perform an OR operation for all signals from output terminals OUT1 to OUTk of the increment circuit 10N-1' provided at the final stage.

That is, the cutoff completion determination circuit 4 causes a cutoff completion signal FIN to be "0" when all of the signals from the output terminals OUT1 to OUTk of the increment circuit 10N-1' provided at the final stage reach "0."

As illustrated in FIG. 12, the increment circuit 101' includes k-1 AND gates 1021 to 102k-1, k-1 exclusive OR (XOR) gates 1031 to 103k-1, and an OR gate 1040.

An input terminal of the AND gate 1021 provided at the first stage is supplied with a signal (Q output) output from an SFF 31, which is provided at the first stage, through an input terminal ST. The other input terminal of the AND gate 1021 receives a signal that is input through the input terminal IN1 and has an initial value "0."

An input terminal of each of the AND gates 1022 to 102k-1 provided at the $2^{nd}$ to K-$1^{th}$ stages, receives a signal output from a corresponding one of the AND gates 1021 to 102k-2, which is provided at a preceding stage. The other input terminal of each of the AND gates 1022 to 102k-1 receives a signal that is input through a corresponding one of the input terminals IN2 to INk-1 and has an initial value "0."

An input terminal of the XOR gate 1031 provided at the first stage is supplied with the Q output of the SFF 31, which is provided at the first stage, through the input terminal ST. The other input terminal of the XOR gate 1031 receives a signal that is input through the input terminal IN1 and has an initial value "0."

An input terminal of each of the XOR gates 1032 to 103k-1, which are provided at the $2^{nd}$ to K-$1^{th}$ stages, receives a signal output from a corresponding one of the AND gates 1021 to 102k-1, which is provided at a preceding stage. The other input terminal of each of the XOR gates 1032 to 103k-1 receives a signal that is input through a corresponding one of the input terminals IN2 to INk-1 and has an initial value "0."

An input terminal of the OR gate 1040 receives a signal output from the AND gate 102k-1 provided at the final stage. The other input terminal of the OR gate 1040 receives a signal that is input through the input terminal INk and has an initial value "0."

When output signals from output terminals OUT1 to OUTk-1 of the OR gates 1032 to 103k-1 and an output signal from an output terminal OUTk of the OR gate 1040 are all "0," the cutoff completion determination circuit 4 causes the cutoff completion signal FIN to be "0" and notifies that the desired cutoff operations are completed.

FIG. 13 is a timing chart for explaining operations of the increment circuit 101' in FIG. 12. FIG. 13 illustrates the input data of the input terminals IN1 to INk and the output data of the output terminals OUT1 to OUTk, which may be obtained when the logic of the input terminal ST is "0" or "1."

FIG. 13 depicts the input data of the input terminals IN1 to INk and the output data of the output terminals OUT1 to OUTk in the order from the MSB to the LSB.

As illustrated in FIGS. 12 and 13, when the logic of the input terminal ST, that is, the Q output of the SFF 31, is "0," the increment circuit 101' outputs the data, which has been supplied to the input terminals IN1 to INk, from the output terminals OUT1 to OUTk without changing the supplied data. Accordingly, when the logic of the input terminal ST is "0," the output value is equal to the input value and the output value is not incremented.

When the logic of the input terminal ST is "1," the increment circuit 101' increments the data supplied to the input terminals IN1 to INk by one and outputs the incremented data from the output terminals OUT1 to OUTk. Accordingly, when the logic of the input terminal ST is "1," the output value is equal to "the input value+1" and the output value may be incremented.

For example, in the electric fuse cutoff control circuit 400 according to Embodiment 3, when the number "k" is 2, 3, 4, 5 . . . , the largest concurrent cutoff number is 2, 4, 8, 16 . . . , and the largest concurrent cutoff number may not be designated from the other numbers.

Embodiment 4 is conceived so that a given number may be designated as the largest concurrent cutoff number by changing the initial values of the input terminals IN1 to INk of the increment circuit 101', which is provided at the first stage, and operations of the cutoff completion determination circuit 4, that is, by changing the input logic of the AND gate 40.

Figure 14:
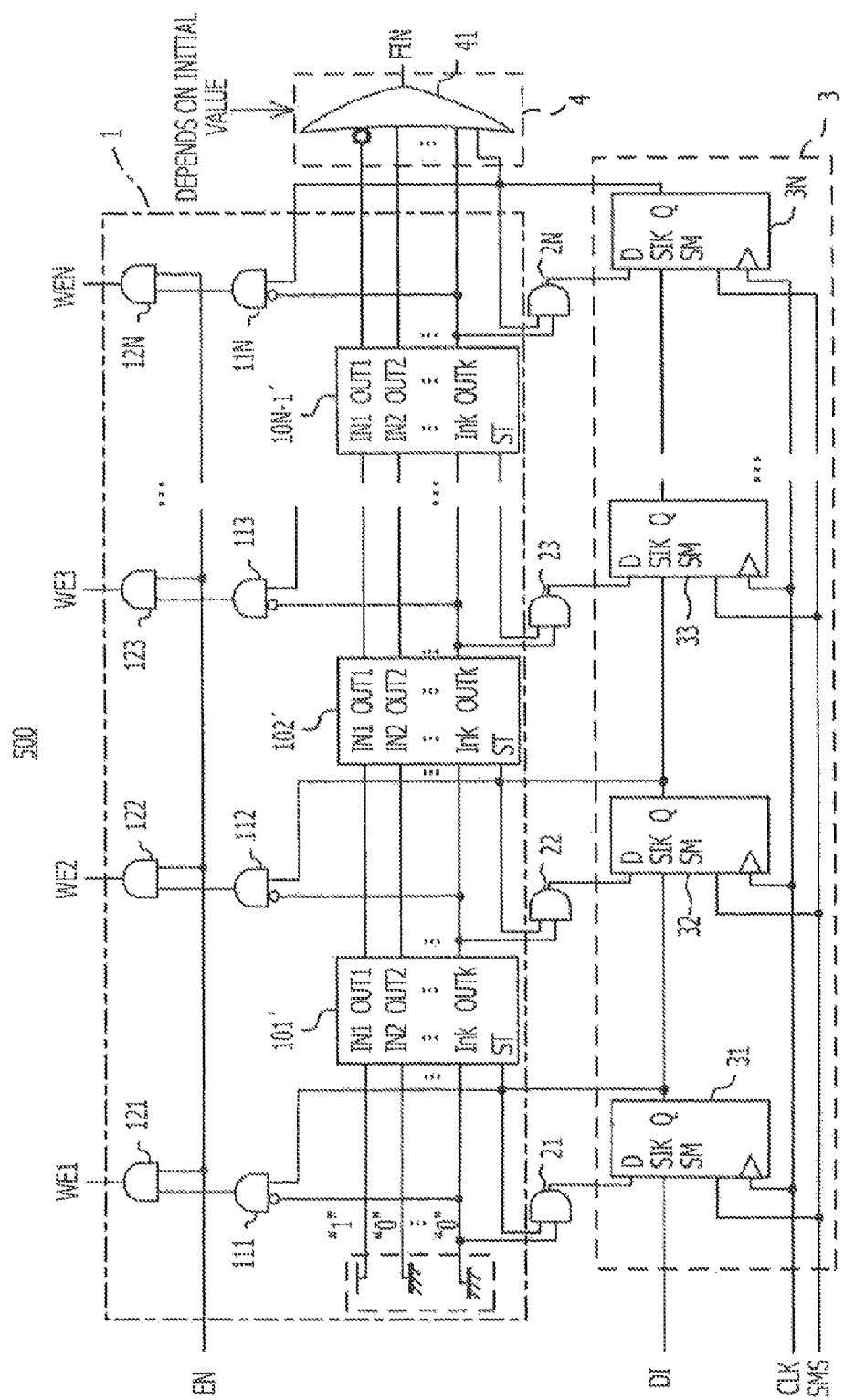
FIG. 14 is a circuit diagram illustrating an electric fuse cutoff control circuit according to Embodiment 4, in accordance with aspects of the present invention.

FIG. 14 is a circuit diagram illustrating an electric fuse cutoff control circuit 500 according to Embodiment 4.

In the electric fuse cutoff control circuit 500 according to Embodiment 4, which is illustrated in FIG. 14, the initial value of an input terminal IN1 is set to "1" instead of setting "0" for all of the initial values of the input terminals IN1 to INk, for example.

The cutoff completion determination circuit 4 includes a k-input OR gate 41 that receives an output signal from an output terminal OUT1 of an increment circuit 10N-1', which is provided at the final stage, at an inverting input terminal based on the initial value "1" of the input terminal IN1 of an increment circuit 101', which is provided at the first stage.

Output signals from the output terminals OUT2 to OUTk of the increment circuit 10N-1', which is provided at the final stage, are received at positive logic input terminals. The maximum concurrent cutoff number may be represented by "$2^{(k-1)}-1$."

The cutoff completion determination circuit 4 may be an OR gate including k input terminals for which a logic is set depending on the initial values set for the input terminals IN1 to INk of the increment circuit 101', which is provided at the first stage.

The electric fuse cutoff control circuit 500 according to Embodiment 4 enables the largest concurrent cutoff number to be set to a given value. For example, the largest concurrent cutoff number for the electric fuses may be set based on a current that the LSI tester for testing the semiconductor device in which the electric fuses are provided may supply.

Figure 15:
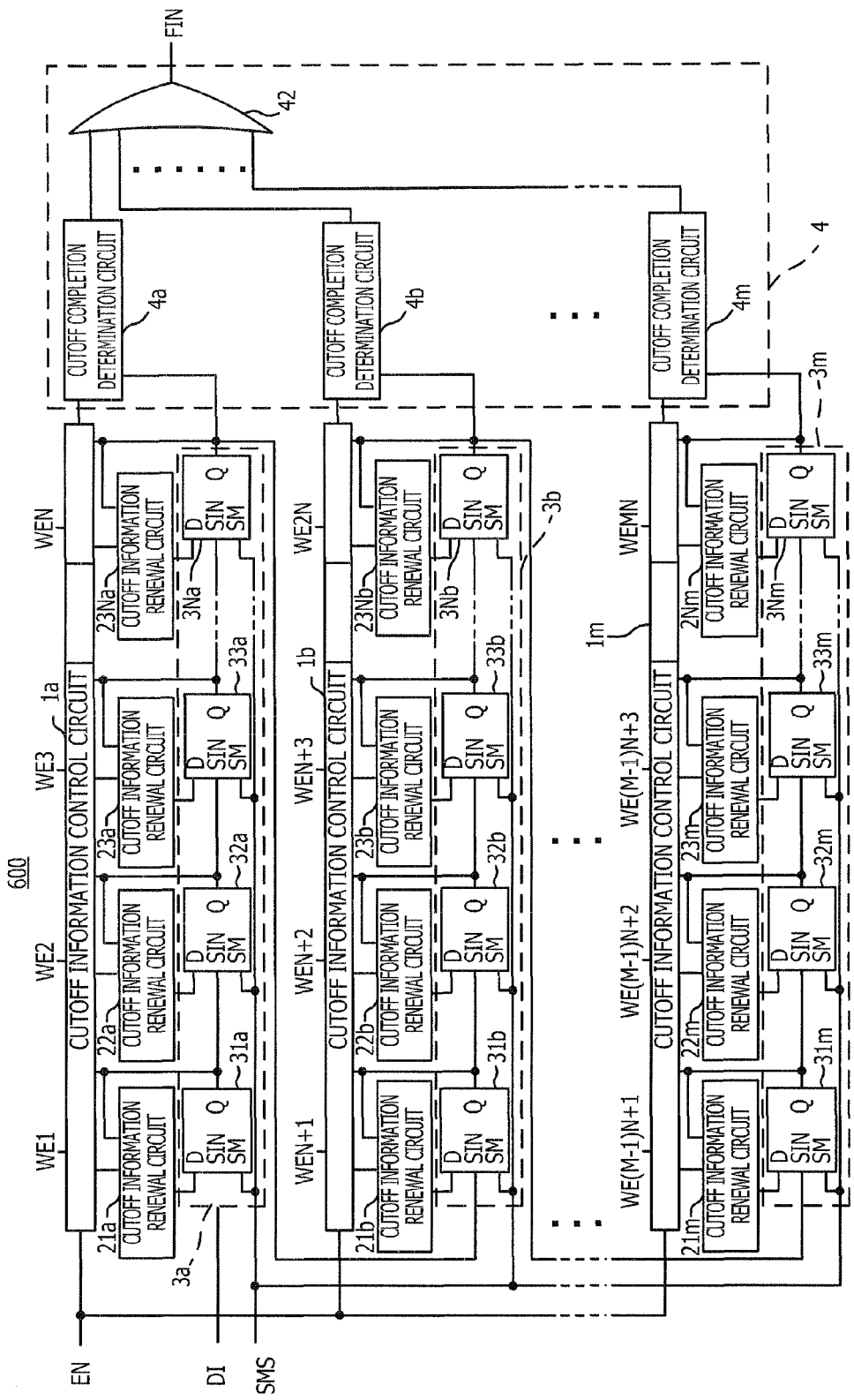
FIG. 15 is a circuit diagram illustrating an electric fuse cutoff control circuit according to Embodiment 5, in accordance with aspects of the present invention.

FIG. 15 is a circuit diagram illustrating an electric fuse cutoff control circuit 600 according to Embodiment 5.

Referring to FIG. 15, the electric fuse cutoff control circuit 600 according to Embodiment 5 is a circuit including the electric fuse cutoff control circuits 200 in FIG. 5, the number of which is M and which are arranged in parallel, for example.

That is, the electric fuse cutoff control circuit 600 in FIG. 15 includes M cutoff information control circuits 1a, 1b, . . . , and 1m, and M×N cutoff information renewal circuits 21a to 2Na, 21b to 2Nb, . . . , and 21m to 2Nm.

The electric fuse cutoff control circuit 600 according to Embodiment 5 further includes M×N SFFs 31a to 3Na, 31b to 3Nb, . . . , and 31m to 3Nm, and M cutoff completion determination circuits 4a, 4b, . . . , and 4m.

Shift registers 3a, 3b, ..., 3m include the SFFs 31a to 3Na, 31b to 3Nb, and 31m to 3Nm.

The cutoff information control circuits 1a, 1b, ..., 1m output cutoff control signals WE1 to WEN, WEN+1 to WE2N, ..., and WE(M−1)N+1 to WEMN.

Output signals from the cutoff completion determination circuits 4a, 4b, ..., and 4m are supplied to an OR gate 42 including m input terminals. When all of the output signals from the cutoff completion determination circuits 4a, 4b, ..., and 4m are "0," the OR gate 42 may output a cutoff completion signal FIN being "0."

The cutoff completion determination circuit 4 in the electric fuse cutoff control circuit 200 according to Embodiment 1, which is illustrated in FIG. 5, corresponds to the cutoff completion determination circuits 4a to 4m and the OR gate 42, which are included in the electric fuse cutoff control circuit 600 according to Embodiment 5.

As mentioned above, the M electric fuse cutoff control circuits 200 illustrated in FIG. 5 are arranged in parallel in the electric fuse cutoff control circuit 600 according to Embodiment 5, for example. This configuration enables the largest concurrent cutoff number in each cutoff control circuit to be 1/M and enables the size of each increment circuit to be 1/M.

Embodiment 5 may be utilized not only in the combination with Embodiment 1 but also in the combination with the other embodiments. For example, when Embodiment 3 in FIG. 11 is combined, the circuit size may be approximately "$\log_2(N/M)/\log_2 N$."

According to Embodiment 5, possible delays caused between the SFFs 31a to 31m, which are provided at the first stages, and the SFFs 3Na to 3Nm, which are provided at the final stages, may be reduced and renewing cycles for the SFFs may be also reduced. Other variations, such as coupling the SFFs in parallel, are also possible.

Figure 16:
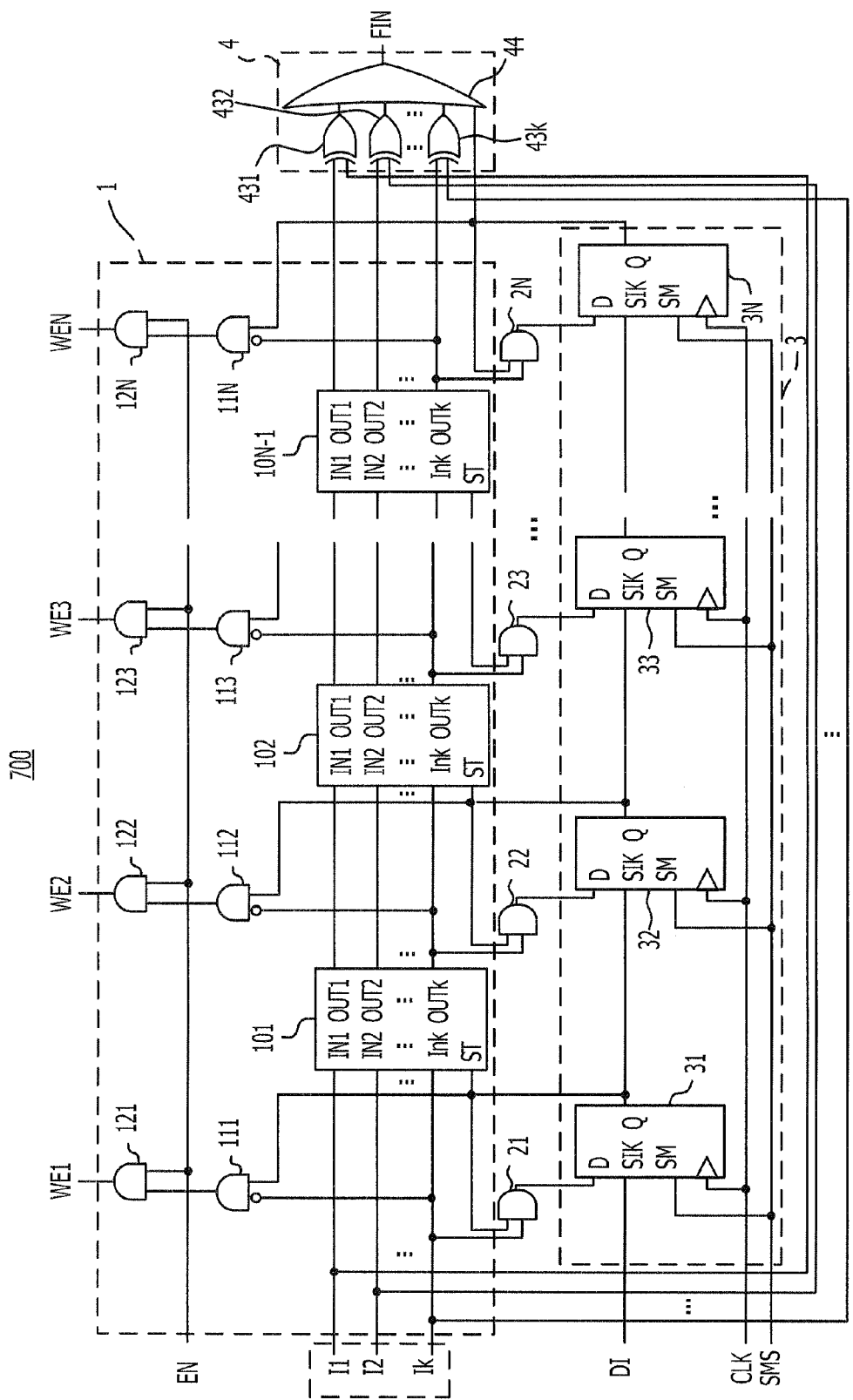
FIG. 16 is a circuit diagram illustrating an electric fuse cutoff control circuit according to Embodiment 6, in accordance with aspects of the present invention.

FIG. 16 is a circuit diagram illustrating an electric fuse cutoff control circuit 700 according to Embodiment 6.

In the electric fuse cutoff control circuit 700 according to Embodiment 6, input terminals IN1 to INk of an increment circuit 101", which is provided at the first stage, may receive signals I1 to Ik input from outside as illustrated in FIG. 16.

A cutoff completion determination circuit 4 includes k XOR gates 431 to 43k and an OR gate 44 that correspond to the signals I1 to Ik supplied to the input terminals IN1 to INk of the increment circuit 101" provided at the first stage.

That is, the XOR gates 431 to 43k may receive the signals I1 to Ik and output signals from output terminals OUT1 to OUTk of an increment circuit 10N-1" provided at the final stage, and may perform an XOR operation for the received signals and supply the logic output to the OR gate 44.

In Embodiment 6, for example, when another LSI tester is used, the largest concurrent cutoff number may be set to a value corresponding to a current that the LSI tester may supply. The value of the largest concurrent cutoff number that may be set using the signals I1 to Ik may be a largest value k or less. For example, the value of k is preferably set to be a little larger than a value assumed to be actually necessary.

Figure 17:
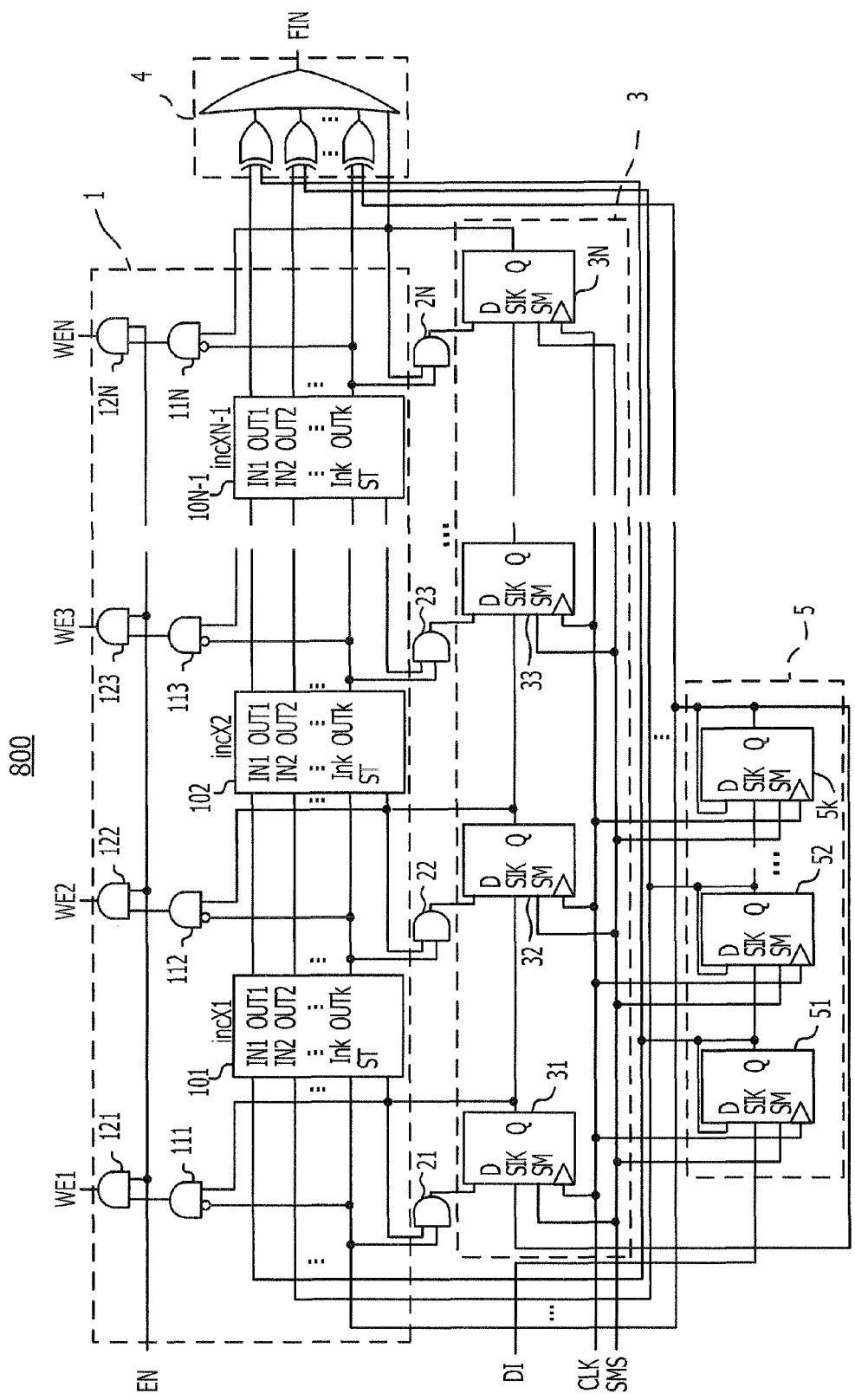
FIG. 17 is a circuit diagram illustrating an electric fuse cutoff control circuit according to Embodiment 7, in accordance with aspects of the present invention.

FIG. 17 is a circuit diagram illustrating an electric fuse cutoff control circuit 800 according to Embodiment 7.

In the electric fuse cutoff control circuit 800 in FIG. 17, input terminals IN1 to INk of an increment circuit 101", which is provided at the first stage, may receive an output signal of a shift register (initial value storage part) 5.

The shift register 5 is coupled to a shift register 3 in series. That is, the shift register 5 includes k SFFs 51 to 5k, and input data DI may be supplied from outside to an input terminal SIN of the SFF 51 provided at the first stage.

The SFF 5k of the shift register 5, which is provided at the final stage, is coupled to an input terminal SIN of an SFF 31 of the shift register 3, which is provided at the first stage. An initial value may be set (stored) for (in) each SFF along with the aforementioned cutoff information DI by sequentially shifting in a scan mode.

The scan mode is set by supplying a scan mode signal SMS to a scan mode input terminal SM of each of the SFFs 51 to 5k, the SFF 31, and SFFs 32 to 3N.

Thus, in the electric fuse cutoff control circuit 800 according to Embodiment 7, the setting of the initial values for the input terminals IN1 to INk of the increment circuit 101" provided at the first stage may be performed concurrently with the setting of the cutoff information for the SFFs 31 to 3N without adding any external terminals.

Figure 18:
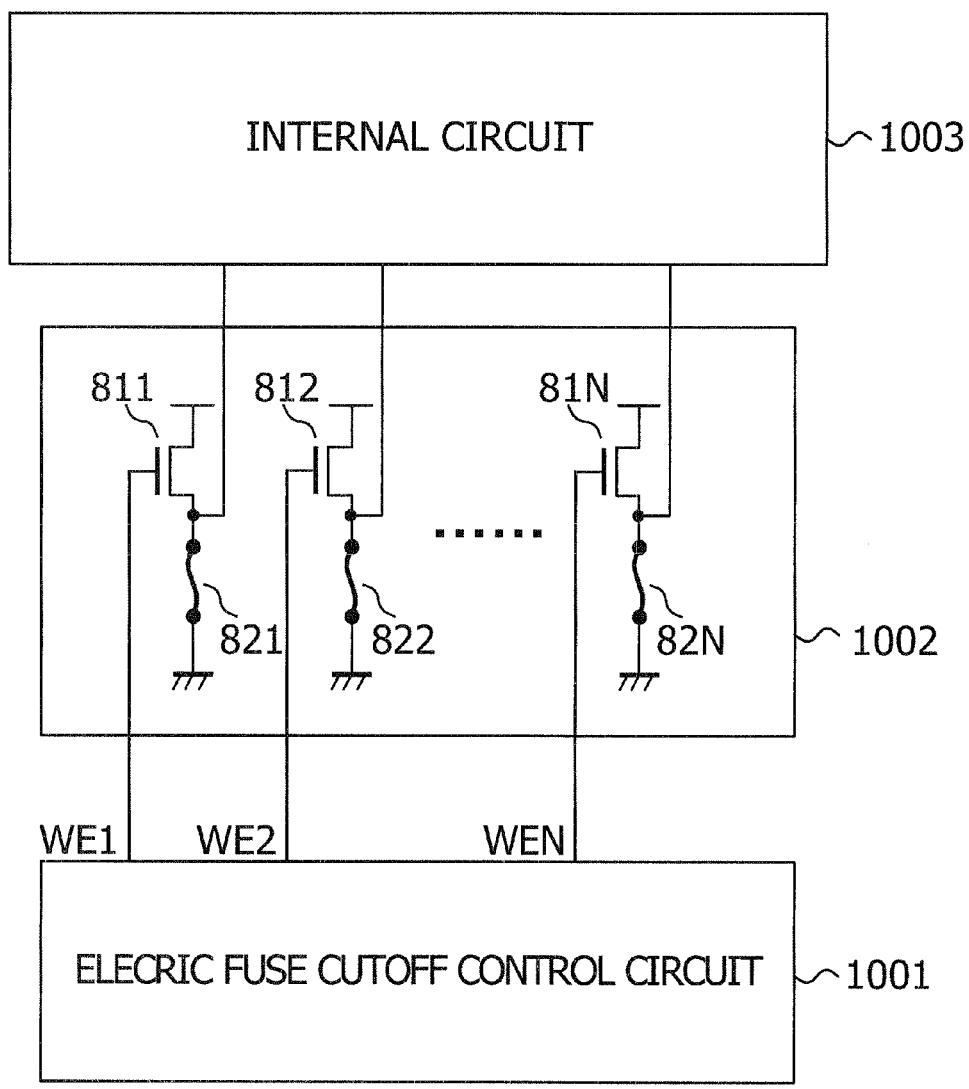
FIG. 18 is a schematic block diagram illustrating the overall configuration of a semiconductor device, in accordance with aspects of the present invention.

FIG. 18 is a schematic block diagram illustrating the overall configuration of a semiconductor device 1000.

As illustrated in FIG. 18, the semiconductor device 1000 to which any one of the above-described embodiments may be applied includes an electric fuse cutoff control circuit 1001, an electric fuse circuit 1002, and an internal circuit 1003.

The electric fuse circuit 1002 includes two or more (N) electric fuses 821 to 82N and two or more (N) cutoff circuits 811 to 81N, and may control the cutoff of corresponding electric fuses based on cutoff control signals WE1 to WEN from the electric fuse cutoff control circuit 1001.

For example, an electric fuse is cut off to hold recovery data for a redundant memory, identification data inherent in a chip, encrypted data for security, or trimming data for adjusting a voltage or timing in an internal circuit.

Although the embodiment in accordance with aspects of the present invention are numbered with, for example, "first," "second," or "third," the ordinal numbers do not imply priorities of the embodiment. Many other variations and modifications will be apparent to those skilled in the art.

All examples and conditional language recited herein are intended for pedagogical purposes to aid the reader in understanding the aspects of the invention and the concepts contributed by the inventor to furthering the art, and are to be construed as being without limitation to such specifically recited examples and conditions, nor does the organization of such examples in the specification relate to a showing of the superiority and inferiority of the aspects of the invention. Although the embodiments in accordance with of the present invention have been described in detail, it should be understood that the various changes, substitutions, and alterations could be made hereto without departing from the spirit and scope of the invention.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

All examples and conditional language recited herein are intended for pedagogical purposes to aid the reader in understanding the principles of the aspects of the invention and the concepts contributed by the inventor to furthering the art, and are to be construed as being without limitation to such specifically recited examples and conditions. Although the embodiments in accordance with aspects of the present inventions have been described in detail, it should be understood that the various changes, substitutions, and alterations could be made hereto without departing from the spirit and scope of the invention.

What is claimed is:

1. An electric fuse cutoff control circuit configured to control cutoff of a plurality of electric fuses, comprising:
 a cutoff information storage circuit configured to store cutoff information about whether or not each of the plurality of electric fuses is cut off;
 a cutoff information control circuit configured to control the cutoff of the plurality of electric fuses based on an output signal of the cutoff information storage circuit, the cutoff information circuit including a plurality of increment, circuits each of which increments a input signal; and
 a cutoff information renewal circuit configured to receive an output signal of the cutoff information control circuit and renewing the cutoff information set for the cutoff information storage circuit,
 wherein each of the plurality of increment circuits increments the input signal based on the output signal of the cutoff information storage circuit.

2. The electric fuse cutoff control circuit according to claim 1, wherein the cutoff information control circuit controls the cutoff of the plurality of electric fuses such that a subset of the plurality of electric fuses are concurrently cut off in a cutoff operation based on a largest concurrent cutoff number indicating the number of electric fuses that can be concurrently cut off in the cutoff operation.

3. The electric fuse cutoff control circuit according to claim 1, wherein the cutoff information control circuit includes a count circuit including the plurality of increment circuits each of which includes an input terminal and an output terminal, the number of the input and output terminals corresponding to a largest concurrent cutoff number.

4. An electric fuse cutoff control circuit configured to control cutoff of a plurality of electric fuses, comprising:
 a cutoff information storage circuit configured to store cutoff information about whether or not each of the plurality of electric fuses is cut off;
 a cutoff information control circuit configured to control the cutoff of the plurality of electric fuses based on an output signal of the cutoff information storage circuit; and
 a cutoff information renewal circuit configured to receive an output signal of the cutoff information control circuit and renewing the cutoff information set for the cutoff information storage circuit,
 wherein the cutoff information control circuit includes a count circuit including a plurality of increment circuits each of which includes an input terminal and an output terminal, the number of the input and output terminals corresponding to a largest concurrent cutoff number indicating a number of electric fuses to be concurrently cut off in a cutoff operation,
 wherein the number of the plurality of increment circuits in the count circuit is N-1 where N represents a total number of the plurality of electric fuses.

5. The electric fuse cutoff control circuit according to claim 4, wherein the cutoff information storage circuit includes N registers, N corresponding to the total number of the plurality of electric fuses, and each of the N registers sets the cutoff information about whether or not it is desirable to cut off each of the plurality of electric fuses.

6. The electric fuse cutoff control circuit according to claim 5, wherein each of the N registers is a scan flip flop.

7. The electric fuse cutoff control circuit according to claim 5, wherein the number of the cutoff information renewal circuits is N, the N cutoff information renewal circuits being provided to correspond to the registers, and wherein each of the cutoff information renewal circuits changes the cutoff information stored in the registers corresponding to the electric fuses that are cut off.

8. The electric fuse cutoff control circuit according to claim 7, wherein the cutoff information renewal circuit rewrites data of a corresponding one of the registers by an OR operation performed for an output signal of the corresponding register and one of an initial value and a given output signal of a corresponding one of the increment circuits.

9. The electric fuse cutoff control circuit according to claim 4, wherein the input terminal of the increment circuit provided at a first stage is supplied with an initial value of a logic "0," the increment circuit provided at the first stage being included in the N-1 increment circuits.

10. The electric fuse cutoff control circuit according to claim 9, further comprising:
 a cutoff completion determination circuit configured to determine that the cutoff operations are completed for all of electric fuses desired to be cut off, the electric fuses desired to be cut off being included in the plurality of electric fuses.

11. The electric fuse cutoff control circuit according to claim 10, wherein the cutoff completion determination circuit includes an OR gate performing an OR operation for a signal output from the output terminal corresponding to a least significant bit of the increment circuit provided at a final stage, and an output signal from the register provided at a final stage in the cutoff information storage circuit, wherein the increment circuit provided at the final stage is included in the N-1 increment circuits.

12. The electric fuse cutoff control circuit according to claim 11, wherein the electric fuse cutoff control circuit includes two or more sets of the electric fuse cutoff control circuits arranged in parallel, wherein the electric fuse cutoff control circuit performs an OR operation for output signals of the cutoff completion determination circuits corresponding to the sets of the electric fuse cutoff control circuits, and wherein the electric fuse cutoff control circuit outputs a cutoff completion determination signal.

13. The electric fuse cutoff control circuit according to claim 4, wherein each of the N-1 increment circuits is an increment circuit obtained by representing an input value and an output value in binary, and wherein each of the N-1 increment circuits sets an initial value for being applied to the input terminal of the increment circuit provided at a first stage.

14. The electric fuse cutoff control circuit according to claim 13, wherein the initial value is a signal directly supplied to the input terminal of the increment circuit provided at the first stage.

15. The electric fuse cutoff control circuit according to claim 13, further comprising:
 an initial value storage circuit adapted to store the initial value,
 wherein the setting of the initial value is performed for the initial value storage circuit concurrently with the setting of the cutoff information for the cutoff information storage circuit.

16. The electric fuse cutoff control circuit according to claim 13, further comprising:
 a cutoff completion determination circuit configured to determine that the cutoff operations are completed for all of electric fuses desired to be cut off, the electric fuses desired to be cut off being included in the plurality of electric fuses.

17. The electric fuse cutoff control circuit according to claim 16, wherein the cutoff completion determination circuit includes:
   a plurality of XOR gates each of which performs an XOR operation for output signals corresponding to all bits of an increment circuit provided at a final stage and initial values corresponding to all bits of the increment circuit provided at the first stage, the increment circuits provided at the first and final stages being included in the N-1 increment circuits; and
   an OR gate configured to perform an OR operation for output signals of the plurality of XOR gates.

18. The electric fuse cutoff control circuit according to claim 16, wherein the electric fuse cutoff control circuit includes two or more sets of the electric fuse cutoff control circuits arranged in parallel, wherein the electric fuse cutoff control circuit performs an OR operation for output signals of the cutoff completion determination circuits corresponding to the sets of the electric fuse cutoff control circuits, and wherein the electric fuse cutoff control circuit outputs a cutoff completion determination signal.

19. A semiconductor device, comprising:
   an electric fuse cutoff control circuit configured to control cutoff of a plurality of electric fuses, including:
   a cutoff information storage circuit configured to store cutoff information about whether or not each of the plurality of electric fuses is cut off;
   a cutoff information control circuit configured to control the cutoff of the plurality of electric fuses based on an output signal of the cutoff information storage circuit, the cutoff information circuit including a plurality of increment circuits each of which increments a input signal; and
   a cutoff information renewal circuit configured to receive an output signal of the cutoff information control circuit and renewing the cutoff information set for the cutoff information storage circuit;
   an electric fuse circuit including the plurality of electric fuses, the cutoff of the plurality of electric fuses being controlled by the electric fuse cutoff control circuit; and
   an internal circuit for which the electric fuse circuit performs a given setting,
   wherein each of the plurality of increment circuits increments the input signal based, on the output signal of the cutoff information storage circuit.

20. The semiconductor device according to claim 19, wherein the electric fuse circuit further includes a plurality of cutoff circuits each of which is coupled to each of the plurality of electric fuses in series, and wherein on and off states of each of the plurality of cutoff circuits being controlled based on a cutoff control signal from the electric fuse cutoff control circuit.

* * * * *